United States Patent
Kim et al.

(10) Patent No.: US 8,901,643 B2
(45) Date of Patent: Dec. 2, 2014

(54) SEMICONDUCTOR DEVICE AND METHOD OF MANUFACTURING THE SAME

(71) Applicant: Samsung Electronics Co., Ltd., Gyeonggi-do (KR)

(72) Inventors: Bi-o Kim, Seoul (KR); Jin-tae Noh, Suwon-si (KR); Chang-woo Sun, Hwaseong-si (KR); Jae-young Ahn, Seongnam-si (KR); Seung-hyun Lim, Seoul (KR); Ki-hyun Hwang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/796,394

(22) Filed: Mar. 12, 2013

(65) Prior Publication Data

US 2013/0270631 A1    Oct. 17, 2013

(30) Foreign Application Priority Data

Apr. 13, 2012    (KR) .................. 10-2012-0038710

(51) Int. Cl.
| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 27/115 | (2006.01) |
| H01L 29/78 | (2006.01) |
| H01L 29/423 | (2006.01) |

(52) U.S. Cl.
CPC ...... *H01L 29/7827* (2013.01); *H01L 27/11524* (2013.01); *H01L 27/11582* (2013.01); *H01L 27/1157* (2013.01); *H01L 29/42332* (2013.01); *H01L 27/11556* (2013.01)
USPC .......................................... 257/329; 257/328

(58) Field of Classification Search
CPC ................ H01L 29/66666; H01L 29/8083; H01L 29/7827; H01L 29/7926; H01L 29/8122; H01L 29/78642; H01L 27/2454; H01L 29/66909; H01L 27/10841; H01L 29/66787; H01L 29/7788
USPC .......... 257/324, 329, 331, 135, 263, 266, 328
See application file for complete search history.

(56) References Cited

U.S. PATENT DOCUMENTS

| | | | |
|---|---|---|---|
| 7,575,973 B2 | 8/2009 | Mokhlesi et al. | |
| 7,956,408 B2 | 6/2011 | Enda et al. | |
| 8,063,438 B2 | 11/2011 | Son et al. | |
| 2009/0173981 A1 | 7/2009 | Nitta | |
| 2009/0180324 A1 | 7/2009 | Ramaswamy et al. | |

(Continued)

FOREIGN PATENT DOCUMENTS

| | | |
|---|---|---|
| JP | 10-093083 | 4/1998 |
| KR | 1020090113606 | 11/2009 |
| KR | 1020110003041 | 1/2011 |
| KR | 1020110037470 | 4/2011 |

*Primary Examiner* — Thien F Tran
(74) *Attorney, Agent, or Firm* — F. Chau & Associates, LLC

(57) ABSTRACT

A semiconductor device includes a channel region extending in a vertical direction perpendicular to a substrate and having a nitrogen concentration distribution, a plurality of gate electrodes arranged on a side wall of the channel region and separated from each other in a vertical direction, and a gate dielectric layer disposed between the channel region and the gate electrodes. The nitrogen concentration distribution has a first concentration near an interface between the channel region and the gate dielectric layer.

13 Claims, 17 Drawing Sheets

(56) References Cited

U.S. PATENT DOCUMENTS

2009/0251963 A1 10/2009 Seol et al.
2010/0090286 A1 4/2010 Lee et al.
2011/0199825 A1 8/2011 Han et al.
2011/0233646 A1* 9/2011 Mizushima et al. .......... 257/324

* cited by examiner

SEMICONDUCTOR DEVICE AND METHOD OF MANUFACTURING THE SAME

CROSS-REFERENCE TO RELATED APPLICATIONS

This application claims priority under 35 U.S.C. §119 from Korean Patent Application No. 10-2012-0038710, filed on Apr. 13, 2012, in the Korean Intellectual Property Office, the disclosure of which is incorporated by reference herein in its entirety.

TECHNICAL FIELD

The inventive concept relates to a semiconductor device and a method of manufacturing the semiconductor device, and more particularly, to a semiconductor device of a vertical structure and a method of manufacturing the semiconductor device.

DISCUSSION OF RELATED ART

As integrity of a memory device increases, a memory device having a vertical transistor structure has been suggested instead of a conventional memory device having a planar transistor structure.

SUMMARY

In an embodiment, a semiconductor device comprises a channel region extending in a vertical direction perpendicular to a substrate and having a nitrogen concentration distribution, a plurality of gate electrodes arranged on a side wall of the channel region and separated from each other in a vertical direction, and a gate dielectric layer disposed between the channel region and the gate electrodes. The nitrogen concentration distribution has a first concentration near an interface between the channel region and the gate dielectric layer.

In an embodiment, a semiconductor device includes a channel region comprising a first semiconductor layer including nitrogen of the first concentration. The first semiconductor includes one side which is in contact with the gate dielectric layer. In an embodiment, the channel region further comprises a second semiconductor layer including nitrogen atoms of a second concentration that is lower than the first concentration. The other side of the first semiconductor layer is in contact with the second semiconductor layer. In an embodiment, the first concentration of the nitrogen in the first semiconductor layer ranges from about 0.2 at. % to about 4 at. %. In an embodiment, the second concentration of the nitrogen in the second semiconductor layer ranges from about 20 ppm to about 0.2 at. %.

In an embodiment, a semiconductor device includes a first semiconductor layer having a cylindrical structure. A second semiconductor layer is formed to surround an inner wall of the first semiconductor layer. In an embodiment, an insulating pillar is disposed in the second semiconductor layer.

In an embodiment, a semiconductor device includes a substrate having a recessed region.

In an embodiment, a thickness of a first semiconductor layer is less than a thickness of a second semiconductor layer. The thickness of the second semiconductor layer ranges from twice to twenty times that of the first semiconductor layer.

In an embodiment, a semiconductor device includes a gate dielectric layer comprising a tunnel insulating layer, a charge trapping layer, and a blocking insulating layer that are sequentially stacked on the side wall of the channel region. The gate dielectric layer is disposed on the channel region.

In an embodiment, a semiconductor device includes a channel region having a pillar structure whose outer wall is a first region and whose inside is a second region disposed in the first region. The first region includes nitrogen atoms at a first concentration and the second region includes nitrogen atoms at a second concentration less than the first concentration.

In an embodiment, a semiconductor device a channel region comprises silicon-nitrogen bonding.

In an embodiment, a semiconductor device includes a plurality of insulating layers disposed between gate electrodes, respectively, wherein a lowermost insulating layer of the insulating layers is in contact with a substrate.

In an embodiment, a method of manufacturing a semiconductor device comprises forming alternately stacked layers of a plurality insulating layers and a plurality of sacrificial layers on a semiconductor substrate, wherein lowermost and uppermost layers of the alternately stacked layers are an insulating layer. The method further comprises forming an opening in the alternately stacked layers to expose the substrate, wherein the opening is defined by an exposed sidewall of the alternately stacked layers and the exposed substrate. The method further comprises forming a first semiconductor layer on the opening with an in-situ doping of nitrogen atoms at a first concentration, wherein the first semiconductor layer has a cylindrical structure.

In an embodiment, a method of manufacturing a semiconductor device comprises forming a second semiconductor layer on a first semiconductor layer, wherein the second semiconductor layer has a cylindrical structure. In an embodiment, the method further comprises forming an insulating pillar in the second semiconductor layer. In an embodiment, the forming a second semiconductor layer is performed with an in-situ doping of nitrogen atoms at a second concentration. In an embodiment, the first and the second semiconductor layers are formed of polysilicon.

In an embodiment, a method of manufacturing a semiconductor device comprises removing a plurality of sacrificial layers from alternately stacked layers so that a first semiconductor layer is exposed between the insulating layers, and forming a gate dielectric layer on the first semiconductor layer exposed between the insulating layers.

In an embodiment, a method of manufacturing a semiconductor device comprises forming an opening includes recessing a substrate to predetermined depth from an upper surface of the substrate.

In an embodiment, a method of manufacturing a semiconductor device comprises forming alternately stacked layers of a plurality insulating layers and a plurality of sacrificial layers on a semiconductor substrate, wherein lowermost and uppermost layers of the alternately stacked layers are an insulating layer of the plurality of insulating layers. The method further comprises forming an opening in the alternately stacked layers to expose the substrate, wherein the opening is defined by an exposed sidewall of the alternately stacked layers and the exposed substrate. The method further comprises forming a semiconductor layer to predetermined thickness on the opening, wherein the semiconductor layer has a cylindrical structure which is in contact with the exposed substrate, implanting a predetermined concentration of nitrogen atoms in the semiconductor layer, and diffusing the nitrogen atoms so that the nitrogen atoms have a concentration distribution in the semiconductor layer, wherein the concentration distribution includes a first concentration of nitrogen atoms piled up near an interface between the exposed sidewall of the alternately stacked layers and the semiconductor layer. In an embodiment, the first concentration ranges from about 0.2 at. % to about 4 at. %. In an embodiment, the first concentration locates within about 5% to about 20% of the predetermined thickness of a semiconductor layer from the interface.

In an embodiment, a method of manufacturing a semiconductor device comprises diffusing nitrogen atoms, which is performed by a rapid nitridation process using a gas including NH3, NO or N2O at a temperature of about 600° C. to 900° C. and a pressure of about 0.1 Torr to about 200 Torr for a few seconds to a few minutes.

In an embodiment, a method of manufacturing a semiconductor device comprises diffusing nitrogen atoms, which is performed by a remote plasma nitridation process under a remote-plasma excited nitrogen atmosphere at a temperature of about 600° C. to 900° C. and a pressure about 0.1 Torr to about 200 Torr.

In an embodiment, a method of manufacturing a semiconductor device includes a concentration distribution in a channel region, which includes a third concentration of nitrogen atoms piled up opposite an interface between an exposed sidewall of an alternately stacked layers and a semiconductor layer. The concentration distribution further includes a second concentration of nitrogen atoms between the first and the third concentrations, and the second concentration is lower than the first and the third concentrations. In an embodiment, a method of manufacturing a semiconductor device includes removing a portion of the semiconductor layer having the third concentration of nitrogen atoms. In an embodiment, the portion of the semiconductor layer has a thickness corresponding to about 10% to about 30% of the predetermined thickness.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
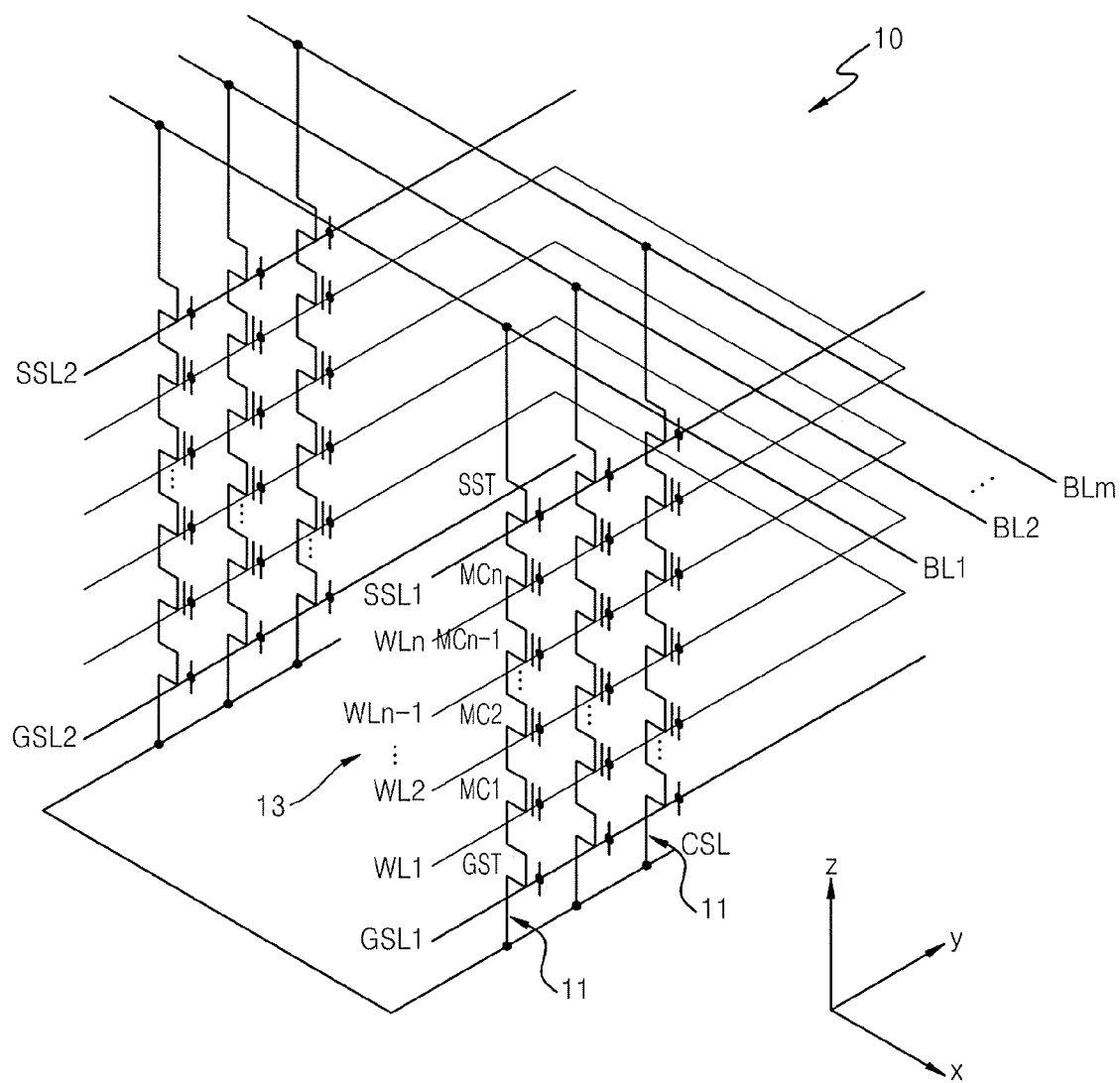
FIG. 1 is an equivalent circuit diagram of a memory cell array in a semiconductor device according to an embodiment of the present inventive concept.

Hereinafter, embodiments of the present inventive concept will be described in detail with reference to accompanying drawings. As used herein, the term "and/or" includes any and all combinations of one or more of the associated listed items. Expressions such as "at least one of," when preceding a list of elements, modify the entire list of elements and do not modify the individual elements of the list.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, the thicknesses of layers and regions are exaggerated for clarity.

FIG. 1 is an equivalent circuit diagram of a memory cell array 10 in a non-volatile memory device according to an embodiment of the present inventive concept. FIG. 1 shows an equivalent circuit diagram of a vertical NAND flash memory device having a vertical channel structure as an example.

Referring to FIG. 1, the memory cell array 10 includes two memory blocks 13 grouped by two string selection lines SSL1 and SSL2, respectively. For simplicity of explanation, the memory cell array 10 is assumed to have two memory blocks. Depending on a memory capacity, the memory cell array 10 includes more than two memory blocks. A memory block 13 includes a plurality of memory cell strings 11, a string selection line SSL1, and a ground selection selection line GSL1. The memory cell array 10 includes a plurality of bit lines BL1, BL2, . . . , BLm-1, and BLm, a plurality of word lines WL1, WL2, . . . , WLn-1, and WLn, and a common source line CSL. The plurality of memory cell strings 11 are formed between the plurality of bit lines BL1, BL2, . . . , BLm-1, and BLm and the common source line CSL.

Each of the memory cell strings 11 includes a string selection transistor SST, a ground selection transistor GST, and a plurality of memory cell transistors MC1, MC2, . . . , MCn-1, and MCn. The drain region of the SST is connected to one of the bit lines BL1, BL2, . . . , BLm-1, and BLm, and the source region of the GST is connected to the common source line CSL. The CSL is a region to which the source regions of the GSTs are commonly connected.

The SST may be connected to one of the string selection lines SSL1 and SSL2, and the GST may be connected to one of the ground selection lines GSL1 and GSL2. In addition, each of the memory cell transistors MC1, MC2, . . . , MCn-1, and MCn may be connected to the word lines WL1, WL2, . . . , WLn-1, and WLn.

The memory cell array 10 is arranged in a three-dimensional structure. The memory cell transistors MC1, MC2, . . . , MCn-1, and MCn in the memory cell strings 11 may be connected serially along a z-axis that is perpendicular to an x-y plane that is parallel with an upper surface of a substrate (not shown). Accordingly, the SSTs, and GSTs, and channel regions of the memory cell transistors MC1, MC2, . . . , MCn-1, and MCn may be substantially perpendicular to the x-y plane. In each of the x-y planes, m memory cells may be provided, and n numbers of the x-y planes may be stacked on the substrate in the z-axis direction. Accordingly, m bit lines BL1, BL2, . . . , BLm-1, and BLm may be connected respectively to the cell strings 11 and n word lines WL1, WL2, . . . , WLn-1, and WLn may be respectively connected to the memory cells.

Figure 2:
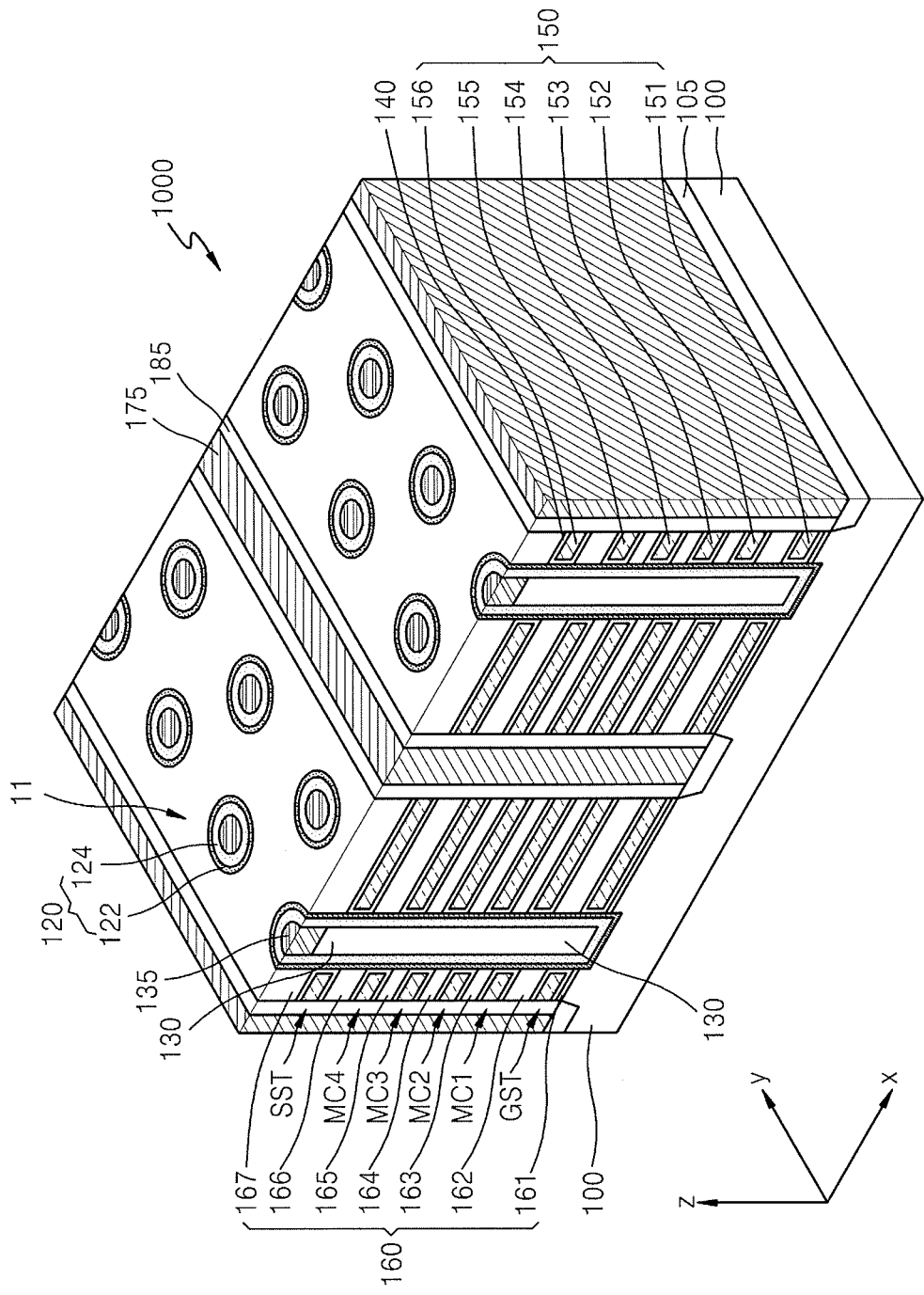
FIG. 2 is a perspective view of a semiconductor device according to an embodiment of the present inventive concept.

FIG. 2 is a perspective view of a semiconductor device 1000 according to an embodiment of the present inventive concept. FIG. 2 shows the semiconductor device 1000 having the cell circuit shown in FIG. 1, and some of the components forming the memory cell strings of FIG. 1, for example, bit lines, are omitted.

Referring to FIG. 2, the semiconductor device 1000 may include the plurality of memory cell strings 11 formed on a substrate 100. Each of the memory cell strings 11 may include a channel region 120 extending in a perpendicular direction to the substrate 100, and a ground selection transistor GST, a plurality of memory cell transistors MC1, MC2, MC3, and MC4, and a string selection transistor SST that are arranged along a side wall of the channel region 120. In an embodiment, the string selection transistor SST may include two or more transistors and the ground selection transistor GST may include two or more transistors.

The channel region 120 may be disposed on the substrate, extending in the z-axis direction perpendicular to the substrate 100. The channel regions 120 may be separated from each other in an x-axis direction and a y-axis direction, and may be arranged in zig-zags in the y-axis direction. That is, the channel regions 120 adjacent to each other in the y-axis direction may be off-set in the x-axis direction.

Each of the channel regions 120 may include a stacked cylindrical structure of a first semiconductor layer 122 and a second semiconductor layer 124. The second semiconductor layer 124 is a cylinder having a closed bottom, and the first semiconductor layer 122 may be formed on an outer wall and a bottom surface of the second semiconductor layer 124 to form the stacked cylindrical structure. In an embodiment, the first semiconductor layer 122 may be also formed as a cylindrical structure having a closed bottom. A thickness of the second semiconductor layer 124 may range from twice to twenty times that of the first semiconductor layer 122.

In an embodiment, the first semiconductor layer 122 may be a polysilicon layer including nitrogen atoms of a first concentration, and the second semiconductor layer may be a polysilicon layer including nitrogen atoms of a second concentration that is lower than the first concentration. For example, the first semiconductor layer 122 may include nitrogen atoms of the first concentration that ranges from about 0.2 to about 4 at. % (atomic percent), and the second semiconductor layer 124 may include nitrogen atoms of the second concentration that ranges from about 20 ppm (part per million) to about 0.2 at. %. In the first semiconductor layer 122 and the second semiconductor layer 124, dangling bonds of Si on the surface may have Si—N bondings. A Si—N bonding has a stronger bonding energy than that of a Si—H bonding. Accordingly, a trapping density of the channel region 120 may be reduced, and electrical characteristics of the semiconductor device 1000 may be improved, which will be described in more detail later with reference to FIGS. 7A through 7C.

The first and second semiconductor layers 122 and 124 may further include p-type impurities or n-type impurities.

An insulating pillar 130 may be formed in the channel region 120. A conductive layer 135 is formed in the channel region 120, contacting on an upper surface of the insulating pillar 130. The conductive layer 135 may be electrically connected to the channel region 120 and may function as a drain region of the SST. For example, the conductive layer 135 may include a material of doped polysilicon.

String selection transistors SSTs arranged in the x-axis direction may be connected to the bit lines (BL of FIG. 1) via the conductive layer 135. The bit lines BL may be formed as line-shaped patterns extending in the x-axis direction, and the conductive layer 135 may be electrically connected to the bit lines BL via bit line contacts (not shown) formed on the conductive layer 135. In addition, the ground selection transistors GSTs arranged in the x-axis direction may be electrically connected to impurity regions 105 adjacent thereto, respectively.

The impurity regions 105 may extend in the y-axis direction in the substrate 100 and may be separated from each other in the x-axis direction. Each of the impurity regions 105 may be disposed between two rows of channel regions 120 in the x-axis direction. The impurity region 105 may be a source region, and may form a PN junction with another region in the substrate 100.

Common source lines 175 (CSL of FIG. 1) may be formed on the impurity regions 105. The common source lines 175 may include a metal silicide, for example, cobalt silicide (CoSix). In addition, the common source lines 175 may include a metal silicide layer and a metal layer formed on the metal silicide layer. For example, the metal layer may be formed of W, Al, or Cu. The common source lines 175 of the present embodiment are not limited to the above example, but may be formed to have various structures. For example, the common source lines 175 may be formed on a partial region on the impurity regions 105 in the y-axis direction, not on the entire upper portions of the impurity regions 105.

Insulating regions 185 may be formed between the common source lines 175 and gate electrodes 150.

The gate electrodes 150 (151 through 156) may be arranged along a side surface of the channel region 120 to be separated from each other in the z-axis direction. The gate electrodes 150 may include a gate electrode 156 of the ground selection transistor GST, gate electrodes 152 through 155 of the memory cell transistors MC1 through MC4, and a gate electrode 151 of the string selection transistor SST. The gate electrodes 150 may be commonly connected to the adjacent memory cell strings 11 arranged in the y-axis direction. The gate electrode 156 of the string selection transistor SST may be connected to the string selection line SSL (refer to FIG. 1). Gate electrodes 152, 153, 154, and 155 of the memory cells MC1 through MC4 may be connected to word lines WL1, WL2, . . . , WLn (refer to FIG. 1). The gate electrode 151 of the ground selection transistor GST may be connected to the ground selection line GSL (refer to FIG. 1). The gate electrodes 150 may be formed of a metal layer, for example, a tungsten (W) layer. Although not shown in FIG. 2, the gate electrodes 150 may further include a diffusion barrier layer (not shown), and the diffusion barrier layer may include one selected from tungsten nitride (WN), tantalum nitride (TaN), and titanium nitride (TiN).

Gate dielectric layers 140 may be disposed between the channel regions 120 and the gate electrodes 150. In particular, each of the gate dielectric layers 140 is formed on one side of the first semiconductor layer 122. The other side of the first semiconductor layer 122 is in contact with the second semiconductor layer 124. Although not shown in detail in FIG. 2, the gate dielectric layer 140 may include a tunneling insulating layer, a charge storing layer, and a blocking insulating layer that are sequentially stacked on the channel region 120. The tunneling insulating layer may tunnel electric charges to the charge storing layer using Fowler-Nordheim (F-N) tunneling. The tunneling insulating layer may include, for example, silicon oxide. The charge storing layer may be a charge trapping layer or a floating gate electrode layer. For example, the charge storing layer may include quantum dots or nano-crystals. Here, the quantum dots or the nano-crystals may include conductive fine particles, for example, metal or semiconductor fine particles. The blocking insulating layer may include a high-k dielectric material. Here, the high-k dielectric material is a dielectric material having a dielectric constant that is higher than that of an oxide layer.

A plurality of insulating layers 160 (161 through 167) may be arranged between the gate electrodes 150, contacting the channel regions 120. The insulating layers 160 may be separated from each other in the z-axis direction, and may extend in the y-axis direction, like the gate electrodes 150. The insulating layers 160 may include silicon oxide or silicon nitride.

For simplicity of explanation, the semiconductor device 1000 of FIG. 2 is assumed to include four memory cells MC1 through MC4 arranged in each of memory strings; however, the present invention is not limited thereto. That is, a memory cell string may include more or less memory cells according to a capacity of the semiconductor memory device. In addition, a memory cell string is assumed to include one string selection transistor SST and one ground selection transistor GST. However, the present invention is not limited thereto. A string selection transistor SST may include two or more transistors. A ground selection transistor GST may include two or more transistors. Such increase in the number of transistors for the string selection transistor SST has the effect of reducing a gate length of the selection gate electrode 156, and thus spaces between the insulating layers 160 may be filled without void. In addition, the string selection transistor SST and the ground selection transistor GST may have different structures from those of the memory cells MC1 through MC4.

According to the semiconductor device 1000, each of the channel regions 120 includes the first semiconductor layer 122 including nitrogen of the first concentration and the second semiconductor layer 124 including nitrogen of the second concentration. Since the first semiconductor layer 122 includes the Si—N bonding having a strong bonding energy, a trap density of electrons in the channel region 120 may be reduced, and a threshold voltage may not be increased. The semiconductor device 1000 of the above structure may have improved electrical characteristics.

Figure 3:
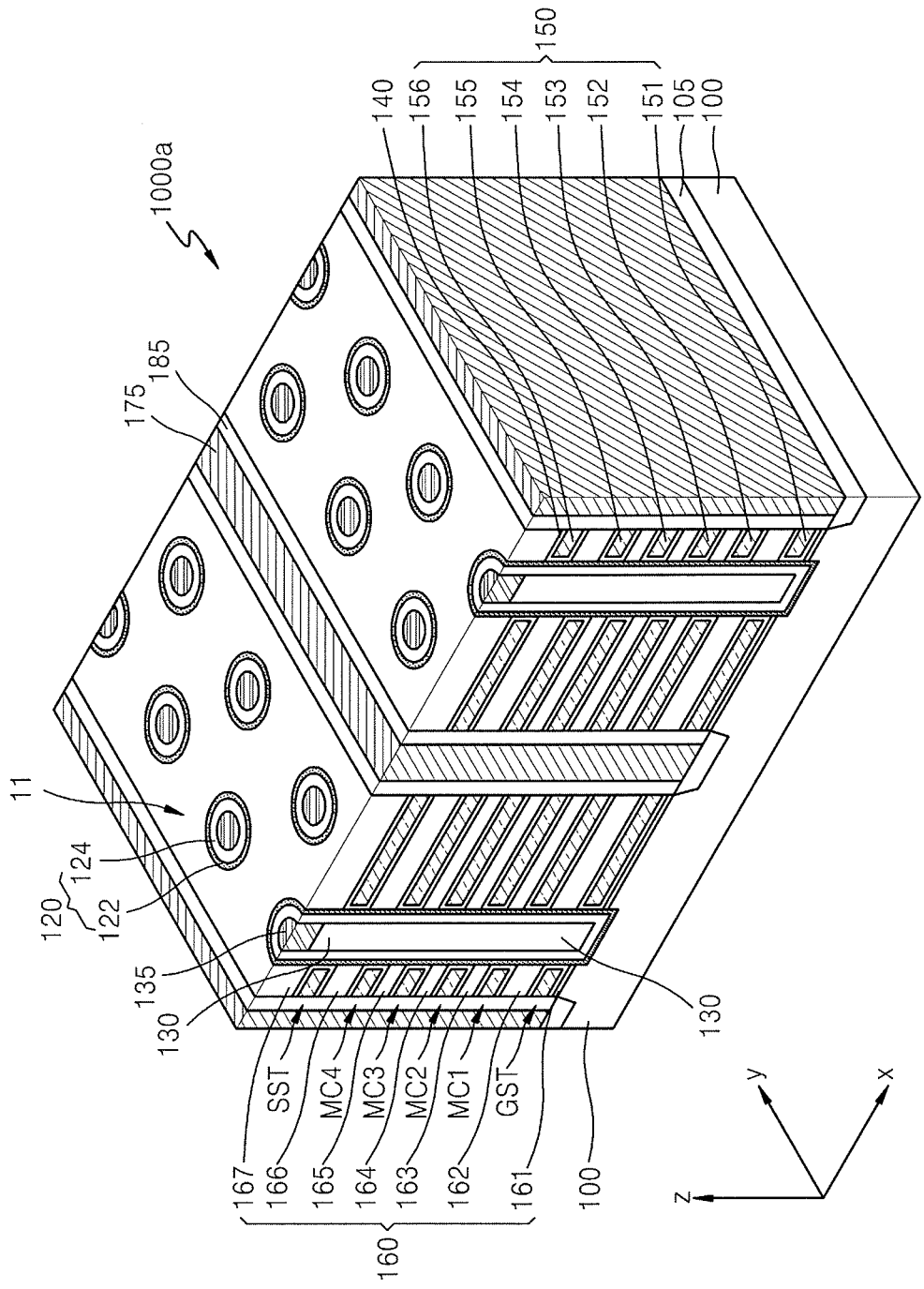
FIG. 3 is a perspective view of a semiconductor device according to an embodiment of the present inventive concept.

FIG. 3 is a perspective view of a semiconductor device 1000a according to an embodiment of the present inventive concept. The semiconductor device 1000a shown in FIG. 3 is substantially similar to the semiconductor device 1000 shown in FIG. 2 except for the structure of the channel regions 120, so differences of the present embodiment from the previous embodiment will be described. Like numerals may refer to like elements and any further descriptions with respect to the same element are omitted for brevity.

Referring to FIG. 3, the channel regions 120 of the semiconductor device 1000a may be arranged extending in the z-axis direction on the substrate 100. Each of the channel regions 120 may be formed as a cylindrical stacked structure including the first semiconductor layer 122 and the second semiconductor layer 124. The second semiconductor layer 124 is formed as a cylinder, and the first semiconductor layer 122 is formed on the outer wall and the bottom surface of the second semiconductor layer 124 to cover the second semiconductor layer 124.

In the embodiment of the present invention, the second semiconductor layer 124 may be a polysilicon layer that does not include nitrogen. In addition, the second semiconductor layer 124 may further include p-type or n-type impurities. The first semiconductor layer 122 may be a polysilicon layer including nitrogen of a first concentration, and the first concentration may range from about 0.2 to about 4 at. %.

According to the semiconductor device 1000a, the first semiconductor layer 122 of the channel region 120 may include Si—N bonding having a bonding energy that is stronger than that of Si—H bonding. Accordingly, a trapping density of the channel region 120 may be reduced, and an interfacial characteristic with the gate dielectric layer 140 formed on a side wall of the first semiconductor layer 122 may be improved. In addition, since the second semiconductor layer 124 in the channel region 120 does not include the nitrogen, degradation of an electric conductivity of the channel region 120 due to the nitrogen inclusion may be prevented. Therefore, the semiconductor device 1000a may have improved electrical characteristics. This will be described in more detail later with reference to FIGS. 7A through 7C.

Figure 4:
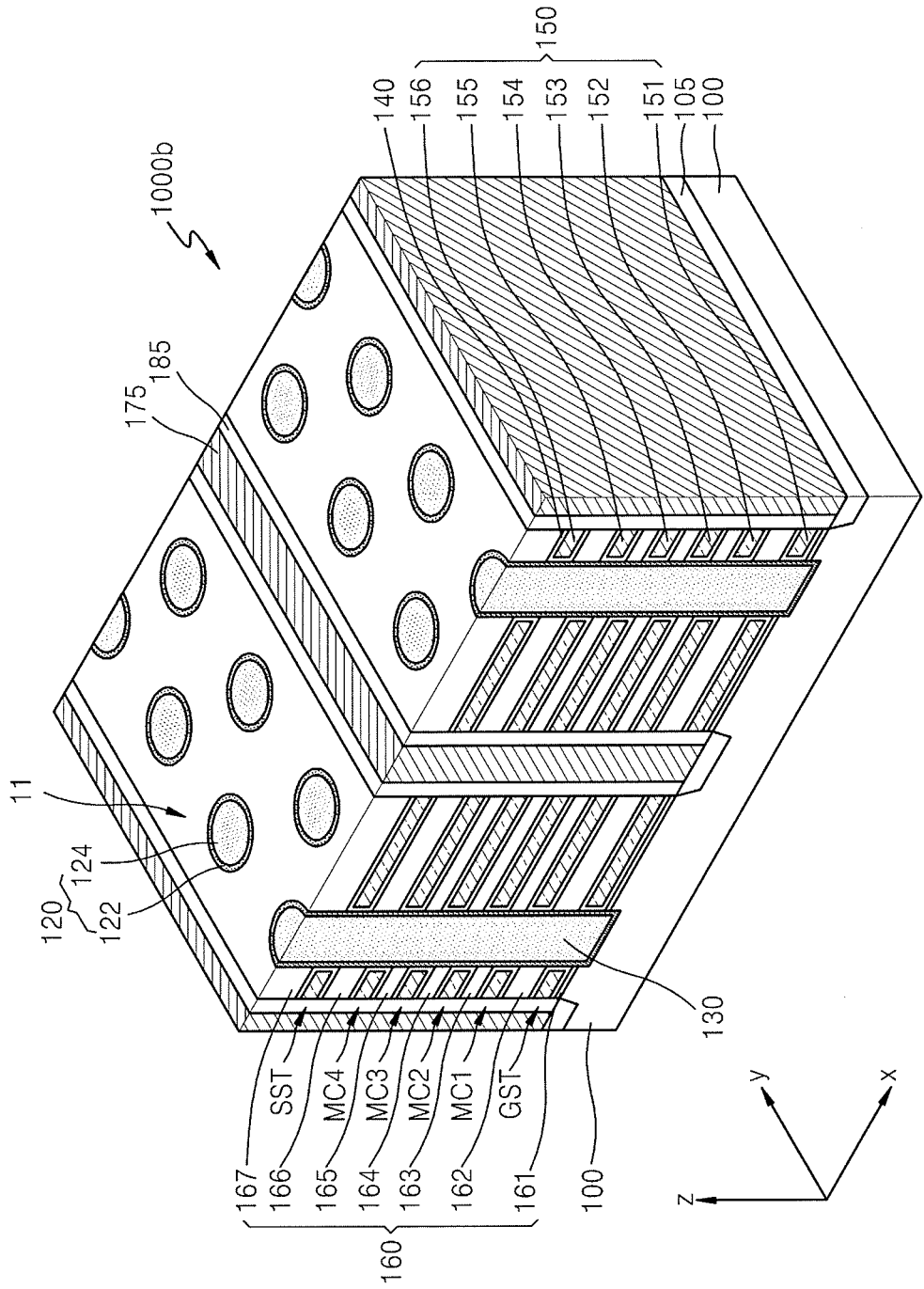
FIG. 4 is a perspective view of a semiconductor device according to an embodiment of the present inventive concept.

FIG. 4 is a perspective view of a semiconductor device 1000b according to an embodiment of the present invention. Since the semiconductor device 1000b of FIG. 4 is similar to the semiconductor device 1000 of FIG. 2 except for the structure of the channel region 120, differences between the above two will be described as follows.

Referring to FIG. 4, the channel regions 120 of the semiconductor device 1000b may be arranged to extend in the z-axis direction on the substrate 100. Each of the channel regions 120 may be formed as a stacked structure including the first semiconductor layer 122 and the second semiconductor layer 124. The second semiconductor layer 122 is formed as a pillar, and the first semiconductor layer 122 is formed on the outer wall and the bottom surface of the second semiconductor layer 124 to cover the second semiconductor layer 124. A thickness of the second semiconductor layer 124 may range from twice to twenty times thicker than that of the first semiconductor layer 122.

In the embodiment of the present inventive concept, the first semiconductor layer 122 may be a polysilicon layer including nitrogen of a first concentration, and the second semiconductor layer 124 may be a polysilicon layer including nitrogen of a second concentration that is lower than the first concentration. For example, the first concentration of the nitrogen included in the first semiconductor layer 122 may range from about 0.2 to about 4 at. %, and the second concentration of the nitrogen included in the second semiconductor layer 124 may range from about 20 ppm to about 0.2 at. %.

Since each of the channel regions 120 includes the second semiconductor layer 124 formed as the pillar and the first semiconductor layer 122 surrounding the second semiconductor layer 124, the each channel region 120 may not include the insulating pillar 130 (refer to FIG. 2) and the conductive layer 135 (refer to FIG. 2). Accordingly, bit line contacts (not shown) may be directly connected to upper portions of the channel regions 120.

According to the semiconductor device 1000b, the first semiconductor layer 122 of the channel region 120 may include the Si—N bonding having the bonding energy that is stronger than that of the Si—H bonding. Accordingly, a trap density in the channel region 120 may be reduced, and an interfacial characteristic with respect to the gate dielectric layer 140 formed on a side wall of the first semiconductor layer 122 may be improved. Therefore, the semiconductor device 1000b may have improved electrical characteristics. This will be described in more detail later with reference to FIGS. 7A through 7C.

FIGS. 5A through 5K are cross-sectional views illustrating a method of manufacturing a semiconductor device according to an embodiment of the present inventive concept. FIGS. 5A through 5K are cross-sectional views of the semiconductor device shown in FIG. 2 seen from the y-axis direction according to processing order.

Figure 5A:
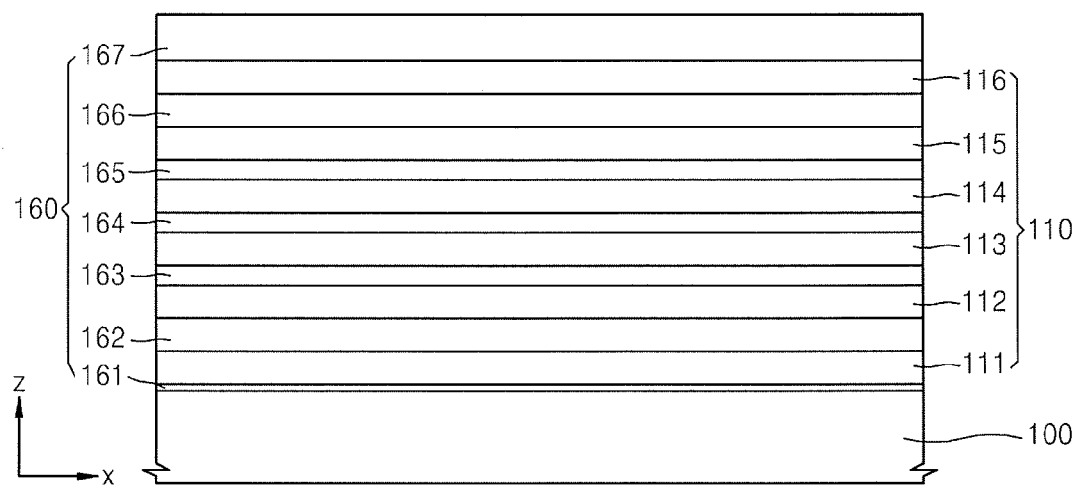
FIGS. 5A through 5K are cross-sectional views illustrating a method of manufacturing a semiconductor device according to an embodiment of the present inventive concept.

Referring to FIG. 5A, a plurality of insulating layers 160 (161 through 167) and a plurality of sacrificial layers 110 (111 through 116) are alternately stacked on the substrate 100. The insulating layers 160 and the sacrificial layers 110 may be alternately stacked on the substrate 100 from the lowermost insulating layer 161 as shown in FIG. 5A.

The sacrificial layers 110 may be formed of a material having etch selectivity with respect to the insulating layers 160. For example, if the insulating layers 160 are formed of silicon oxide, silicon oxynitride, or silicon nitride, the sacrificial layers 110 may be formed of a material selected from silicon, silicon carbide, silicon oxide, and silicon nitride, which is different from the material forming the insulating layers 160.

Thicknesses of the plurality of sacrificial layers 110 and the plurality of insulating layers 160 may differ from each other. For example, the lowermost insulating layer 161 may be formed to have less thickness than other layers. In addition, the number of sacrificial layers 110 and the number of insulating layers 160 may vary depending on the numbers of the memory cell transistors, and upper and lower selection transistors that will be formed in the memory cell strings.

Figure 5B:
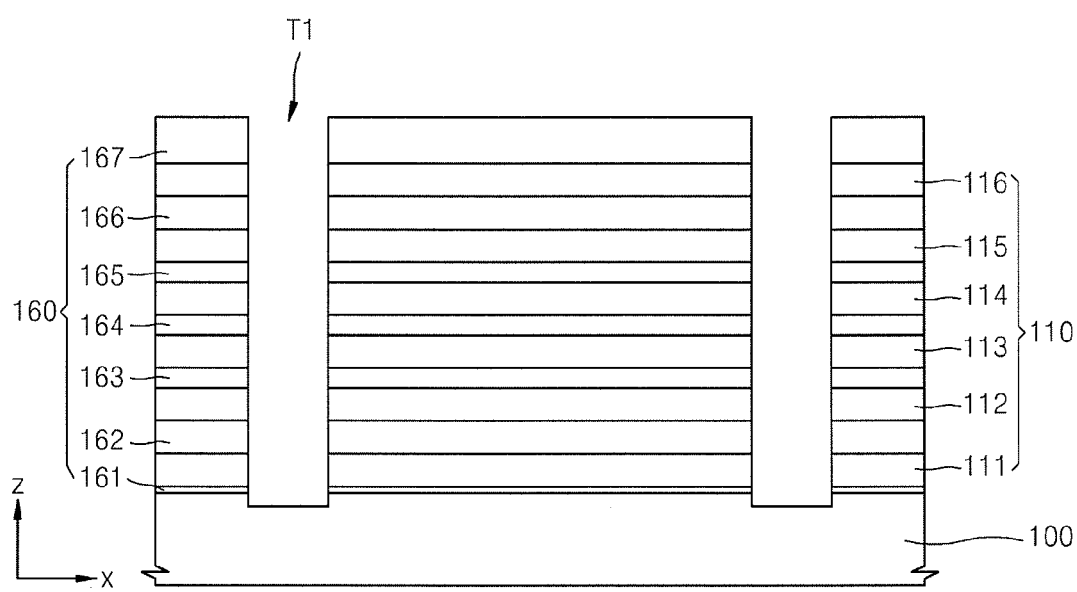

Referring to FIG. 5B, first openings T1 penetrating through the plurality of sacrificial layers 110 and the plurality of insulating layers 160 that are stacked alternately may be formed. Each of the first openings T1 may have a cross-section of various shapes, for example, a circular shape, an oval shape, or a polygonal shape, in the z-axis direction. A plurality of first openings T1 may be separated from each other in the x-axis direction and the y-axis direction.

In the embodiment of the present inventive concept, a mask pattern (not shown) is formed on the insulating layers 160 and the sacrificial layers 110 that are alternately stacked.

The insulating layers 160 and the sacrificial layers 110 may be anisotropically etched using the mask pattern as an etching mask until an upper surface of the substrate 100 is exposed, and then, the first openings T1 are formed. The first openings T1 may expose the upper surface of the substrate 100, and the substrate 100 at a bottom portion of the first openings T1 may be further etched to a predetermined depth from the upper surface of the substrate 100 to form recesses at an upper portion of the substrate 100.

Figure 5C:
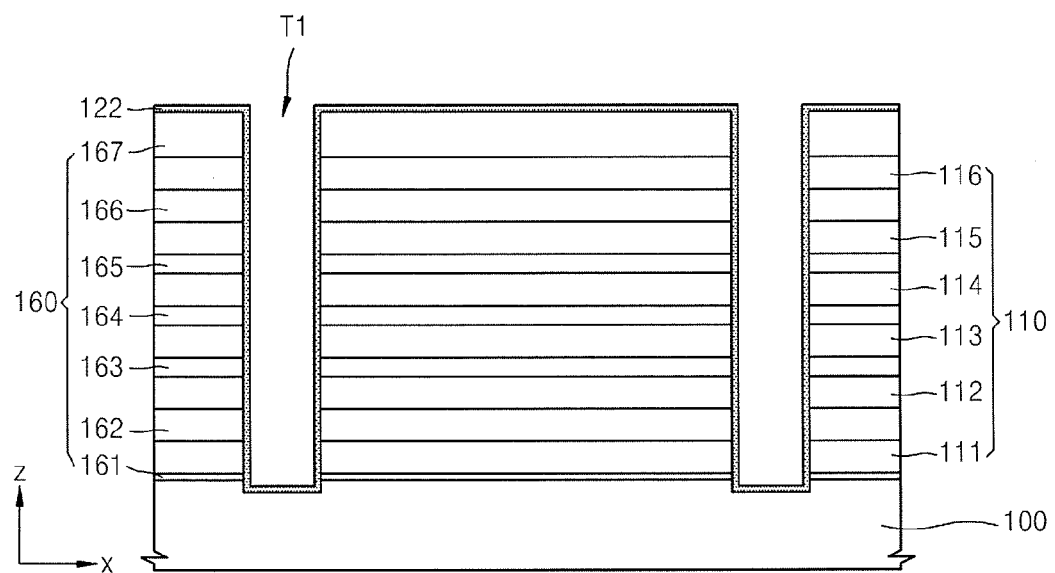

Referring to FIG. 5C, the first semiconductor layer 122 including nitrogen (N) atoms of a first concentration may be formed on side walls and bottom surfaces of the first openings T1. The first semiconductor layer 122 may be formed conformally on the side walls and the bottom surfaces of the first openings T1 to a predetermined thickness, and the first openings T1 may not be completely filled.

According to the present embodiment, the first semiconductor layer 122 may be formed of silicon, silicon-germanium, or germanium. The first semiconductor layer 122 may be formed by an atomic layer deposition (ALD) process, a chemical vapor deposition (CVD) process, low pressure CVD (LPCVD) process, or an ultra high vacuum CVD (UHV-CVD) process. For example, the first semiconductor layer 122 may be formed by performing an in-situ doping of nitrogen during a process of forming the polysilicon layer through the CVD process.

The first semiconductor layer 122 may include nitrogen atoms at a concentration of 1E20 through 2E21 atoms/cm$^3$. For example, the first concentration of the nitrogen included in the first semiconductor layer 122 may range from about 0.2 to about 4 at %. The first semiconductor layer 122 including the nitrogen of the first concentration may include Si—N bonding having a binding energy that is higher than that of Si—H bonding (for example, the binding energy of the Si—N bonding is 3.45 eV that is greater than the binding energy of the Si—H bonding, that is, 3.34 eV). Accordingly, a trapping density of the first semiconductor layer 122 may be reduced. In addition, an interfacial characteristic with respect to a gate dielectric layer 140 (refer to FIG. 5I) that will be formed on the first semiconductor layer 122 in subsequent processes may be improved. On the other hand, if the first concentration of the nitrogen is too high, a grain size of the first semiconductor layer 122 may be reduced and an electron mobility of the first semiconductor layer 122 may be reduced.

In addition, the first semiconductor layer 122 may further include p-type impurities such as phosphorous (P) or arsenic (As), or n-type impurities such as boron (B), in addition to the nitrogen. The impurities may be in-situ doped when the first semiconductor layer 122 is formed. Otherwise, the impurities may be implanted in the first semiconductor layer 122 through an ion implantation process after forming the first semiconductor layer 122.

Figure 5D:
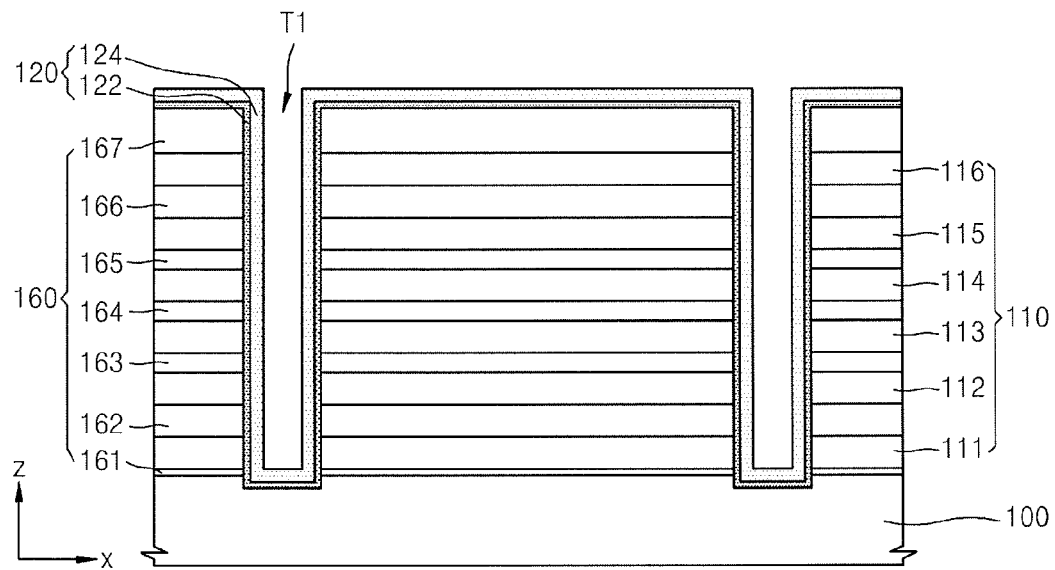

Referring to FIG. 5D, the second semiconductor layer 124 including nitrogen atoms of a second concentration that is lower than the first concentration may be formed on the first semiconductor layer 122. The second semiconductor layers 124 is formed conformally on the first semiconductor layer 122 formed in each of the first openings T1 to a predetermined thickness, and the first opening T1 may not be completely filled. The second semiconductor layer 124 may have greater thickness than the first semiconductor layer 122. For example, the thickness of the second semiconductor layer 124 may range from twice or twenty times greater than that of the first semiconductor layer 122. in an embodiment, the second semiconductor layer 124 may be formed as a pillar in which the first opening T1 is completely filled.

In an embodiment, the second semiconductor layer 124 may include nitrogen atoms at a concentration of 1E18 through 1E20 atoms/cm$^3$. For example, the second concentration of the nitrogen atoms included in the second semiconductor layer 124 may range from about 20 ppm to about 0.2 at %. The second semiconductor layer 124 may be formed by the ALD process, the CVD process, the LPCVD process, or the UHV-CVD process. For example, the second semiconductor layer 124 may be formed by performing an in-situ doping of the nitrogen during forming the polysilicon layer by the CVD process.

In an embodiment of the present inventive concept, the second semiconductor layer 124 may not include nitrogen atoms. For example, the second semiconductor layer 124 may be formed of the polysilicon layer without performing the in-situ doping of nitrogen atoms during forming the polysilicon layer. In this case, the semiconductor device 1000a shown in FIG. 3 may be manufactured. When the second semiconductor layer 124 does not include nitrogen atoms, reduction of the electron mobility in the second semiconductor layer 124 may be prevented due to the inclusion of nitrogen atoms.

The second semiconductor layer 124 may further include n-type impurities such as P and As, or p-type impurities such as B, in addition to the nitrogen. The impurities may be in-situ doped when the second semiconductor layer 124 is formed. Otherwise, the impurities may be implanted in the second semiconductor layer 124 through an ion implantation process after forming the second semiconductor layer 124.

After that, a thermal treatment may be further performed under a gas atmosphere including an inert gas. For example, the thermal treatment may be performed for tens of minutes to a few hours at a temperature ranging from about 550° C. to 700° C. under a gas atmosphere including nitrogen ($N_2$) gas. An inert gas such as helium (He), argon (Ar), and neon (Ne) may be used in the thermal treatment, in addition to the nitrogen gas. According to the thermal treatment process, crystal defects of the first and second semiconductor layers 122 and 124 may be cured.

Figure 5E:
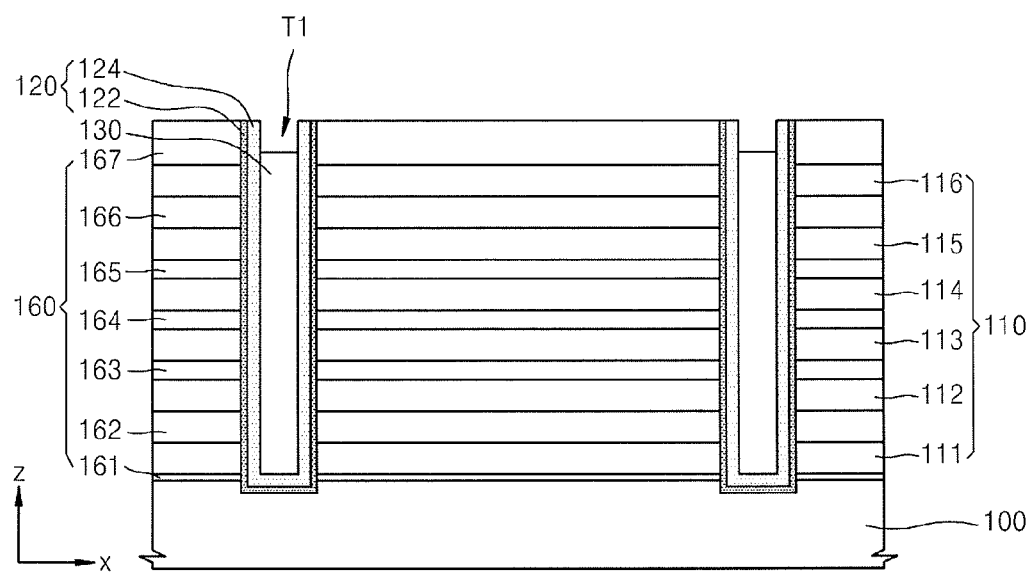

Referring to FIG. 5E, an insulating pillar 130 is formed on the second semiconductor layer 124 to fill the first openings T1. After that, a planarization process such as a chemical mechanical polishing (CMP) may be performed on the insulating pillar 130 until an upper surface of the uppermost insulating layer 167 is exposed. Thus, the first and second semiconductor layers 122 and 124 on the uppermost insulating layer 167 and the insulating pillar 130 on the uppermost insulating layer 167 are removed, and the insulating pillar 130 may remain in the first openings T1.

The first and second semiconductor layers 122 and 124 on the uppermost insulating layer 167 are removed except in the first openings T1. The first and second semiconductor layers 122 and 124 in each of the first openings T1 may form the channel region 120. As shown in FIG. 5E, when the insulating pillar 130 is formed on the inner wall of the second semiconductor layer 124, the channel region 120 may be formed as a cylindrical structure with a closed bottom or a cup structure.

After that, the insulating pillar 130 in the first opening T1 may be further removed to a predetermined depth from the upper surface of the uppermost insulating layer 167 by performing an etch-back process. Accordingly, the upper surface of the insulating pillar 130 is formed at a level that is lower than an upper surface of the second semiconductor layer 124, and an upper portion of the side wall of the second semiconductor layer 124 may be exposed.

In an embodiment, the channel regions 120 may be formed as pillars when the second semiconductor layer 124 may completely fill in the first openings T1, and the insulating pillar 130 may not be formed. For example, after forming the second semiconductor layer 124 so as to fill the first openings T1, the upper surfaces of the first and second semiconductor layers 122 and 124 are planarized until the upper surface of the uppermost insulating layer 167 is exposed. Thus, the channel regions 120 may be formed as pillars in the first openings T1. When each of the channel regions 120 is completely filled in each of the first openings T1, next processes for forming the insulating pillar 130 and the conductive layer 135 (refer to FIG. 5F) may be omitted. In this case, the semiconductor device 1000b shown in FIG. 4 may be manufactured.

Figure 5F:
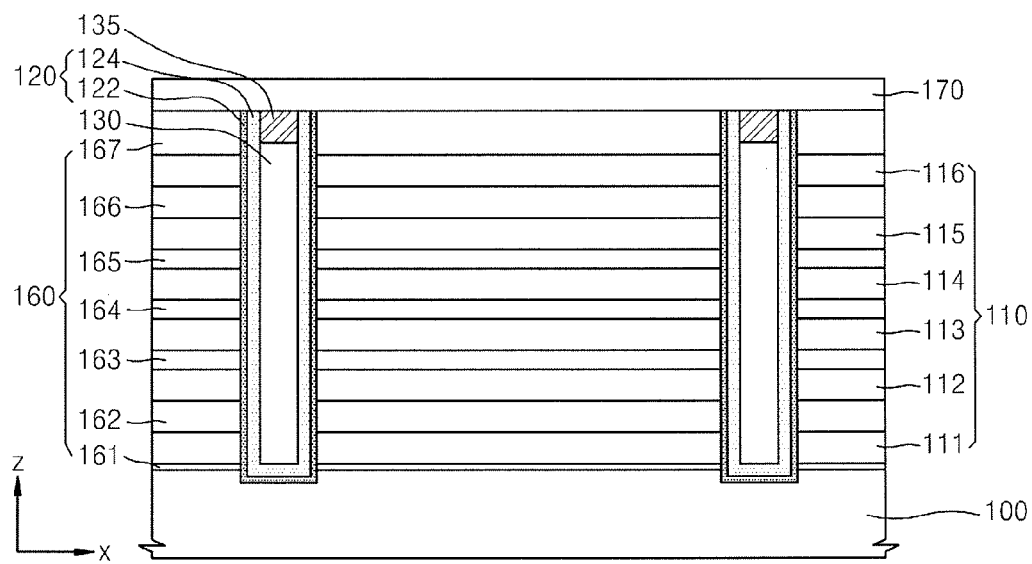

Referring to FIG. 5F, the conductive layer 135 may fill the first openings T1. The conductive layer 135 may be formed on the second semiconductor layer 124 and the insulating pillar 130 to fill the first openings T1 (refer to FIG. 5E). For example, a conductive material (not shown) is formed on the resulting structure of FIG. 5E. In other words, a conductive material is form on the second semiconductor layer 124, the insulating pillar 130, and the uppermost insulating layer 167. The upper portion of the conductive material is planarized to the level of the upper surface of the uppermost insulating layer 167, and the conductive layer 135 is formed. The conductive layer 135 may be formed of a polysilicon layer doped with impurities.

After that, an upper insulating layer 170 may be formed on the uppermost insulating layer 167, the conductive layer 135, and the channel regions 120.

Figure 5G:
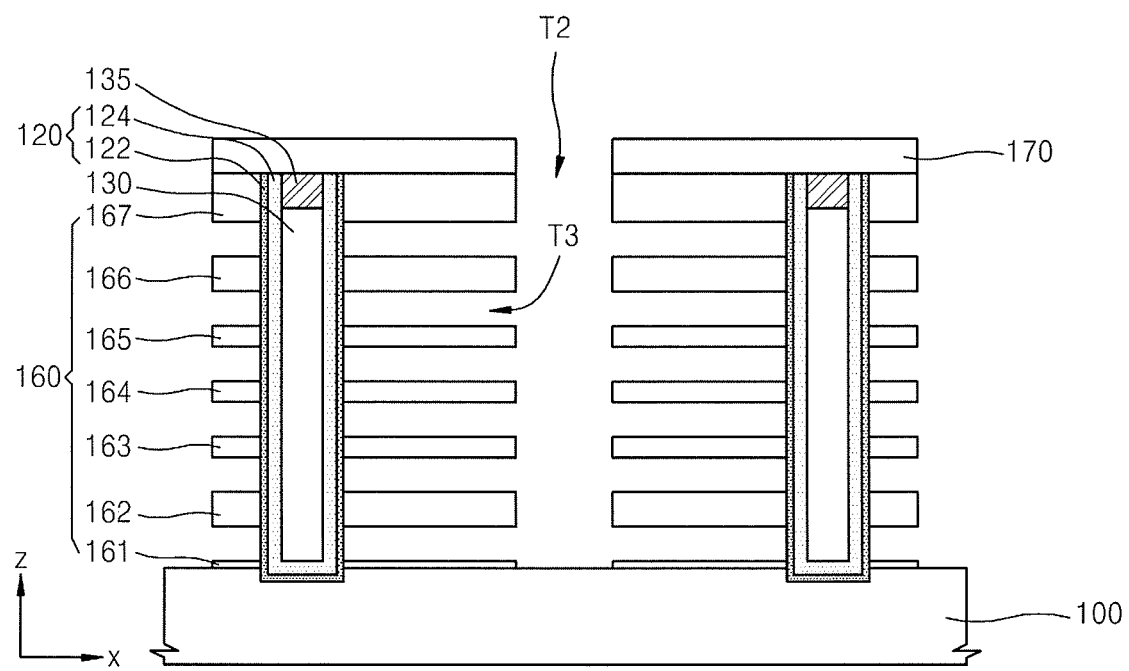

Referring to FIG. 5G, the insulating layers 160, the sacrificial layers 110 (refer to FIG. 5F), and the upper insulating layer 170 between adjacent channel regions 120 are anisotropically etched to form second openings T2 exposing the upper surface of the substrate 100. In the exemplary embodiment, the second openings T2 may extend in the y-axis direction. However, the present inventive concept is not limited to the above example, and relative arrangement of the channel regions 120 and the second openings T2 may vary.

In the second openings T2, the insulating layers 160 and the sacrificial layers 110 may have side surfaces exposed.

After that, the sacrificial layers 110 exposed by the second openings T2 are removed so that third openings T3 are formed in spaces between the insulating layers 160. In an embodiment, the sacrificial layers 110 may be removed by a wet-etching process having etch selectivity with respect to the sacrificial layers 110. Due to such etch selectivity, the insulating layers 160 may not be removed when the sacrificial layers 110 are removed. For example, when the sacrificial layers 110 include silicon nitride and the insulating layers 160 include silicon oxide, the wet-etching process may be performed by using an etchant including phosphoric acid. The channel regions 120 between the insulating layers 160 may be exposed by the third openings T3.

Figure 5H:
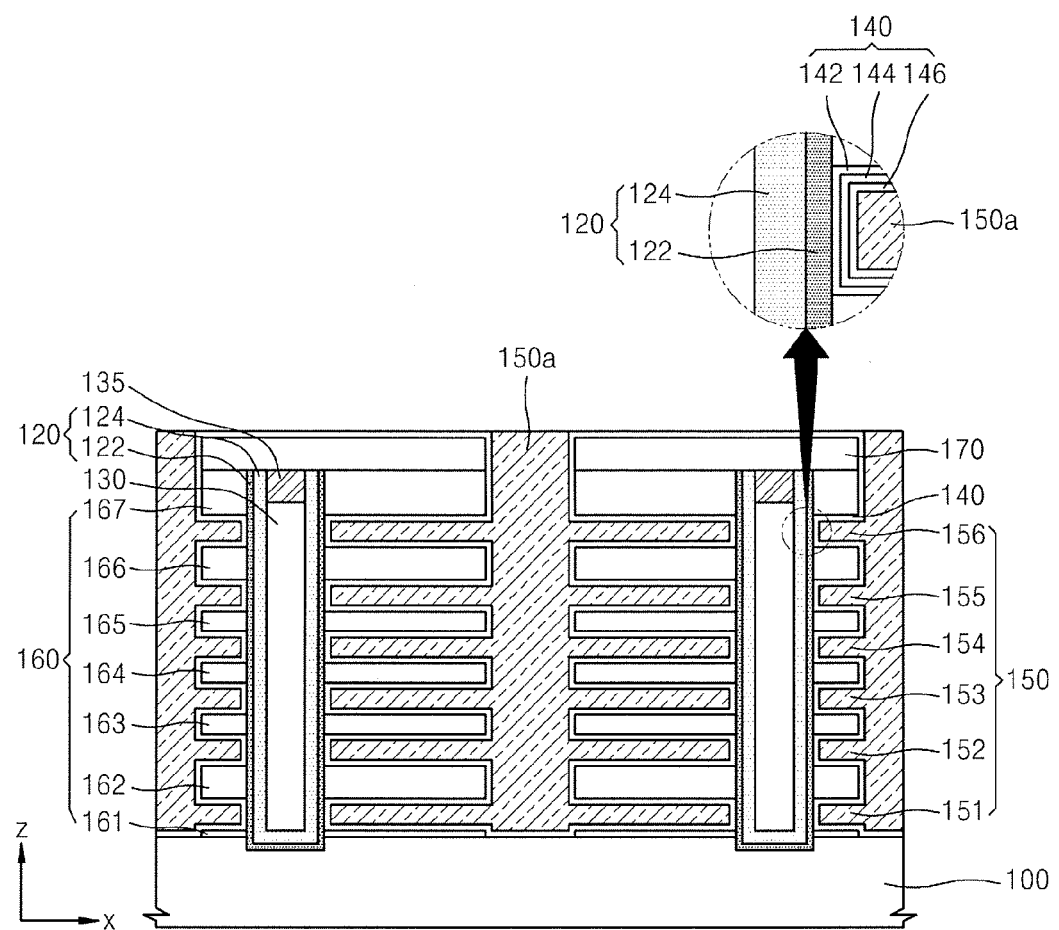

Referring to FIG. 5H, the gate dielectric layer 140 may be formed on the channel regions 120 exposed by the second and third openings T2 and T3 (refer to FIG. 5G), the insulating layers 160, and the substrate 100. The gate dielectric layer 140 may be formed uniformly to a predetermined thickness. The gate dielectric layer 140 may include the tunneling insulating layer 142, the charge storing layer 144, and the blocking insulating layer 146 that are sequentially stacked. The tunneling insulating layer 142, the charge storing layer 144, and the blocking insulating layer 146 may be formed by the ALD process or the CVD process. In an embodiment, the tunneling insulating layer 142 may include silicon oxide. The charge storing layer 144 may be a charge trapping layer or a floating gate layer. The charging storing layer 144 may include quantum dots or nano-crystals. The quantum dots or the nano-crystals may include fine particles of a conductive material, for example, metal or semiconductor. The blocking insulating layer 146 may include a high-k dielectric material having a high dielectric constant.

After that, the second and third openings T2 and T3 may be filled with a gate electrode layer 150a. In an embodiment, the gate electrode layer 150a may be formed by an electroplating process using a metal such as tungsten, copper, aluminum, titanium, tantalum, or ruthenium. On the other hand, before forming the gate electrode layer 150a, a process of forming a diffusion barrier layer (not shown) on the gate dielectric layer 140 may be performed. The diffusion barrier layer may include tungsten nitride, tantalum nitride, or titanium nitride.

Figure 5I:
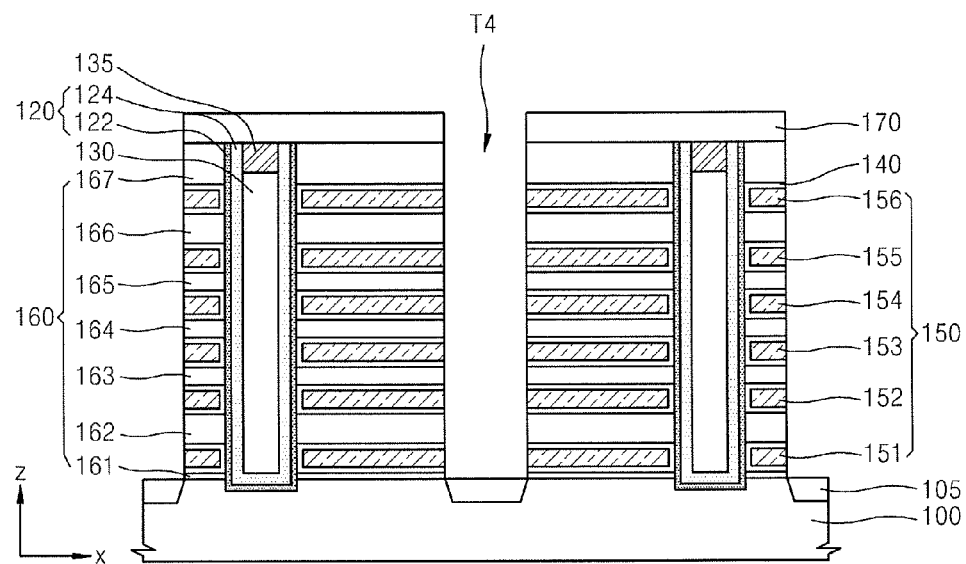

Referring to FIG. 5I, fourth openings are formed at the location of the second openings T2 of FIG. 5G by etching anisotropically the gate electrode layer 150a. The fourth opening T4 may extend in the y-axis direction. As a result of forming the fourth openings T4, the gate electrode layer 150a of FIG. 5H remains in the third opening T3 so that gate electrodes 150 are formed between the insulating layers 160. Since the conductive material is filled only in the third openings T3 by forming the fourth openings T4, gate electrodes 150 (151 through 156) of the ground selection transistor GST, the plurality of memory cells MC1 through MC4, and the string selection transistor SST may be formed.

In an embodiment, the gate electrode layer 150a may be partially removed by the anisotropic etching process. On the other hand, the gate dielectric layer 140 formed on the upper surface of the substrate 100 and the upper insulating layer 170 may be also removed by the anisotropic etching process. The gate dielectric layer 140 formed on the side walls of the insulating layer 160 may be removed or may not be removed in the anisotropic etching process.

After that, impurity regions 105 are formed in the substrate by implanting impurities onto the upper portions of the substrate 100 exposed by the fourth openings T4. The impurities may be n-type impurities such as P and As, or p-type impurities such as B. The impurity regions 105 may function as source regions of the ground selection transistor GSTs.

Figure 5J:
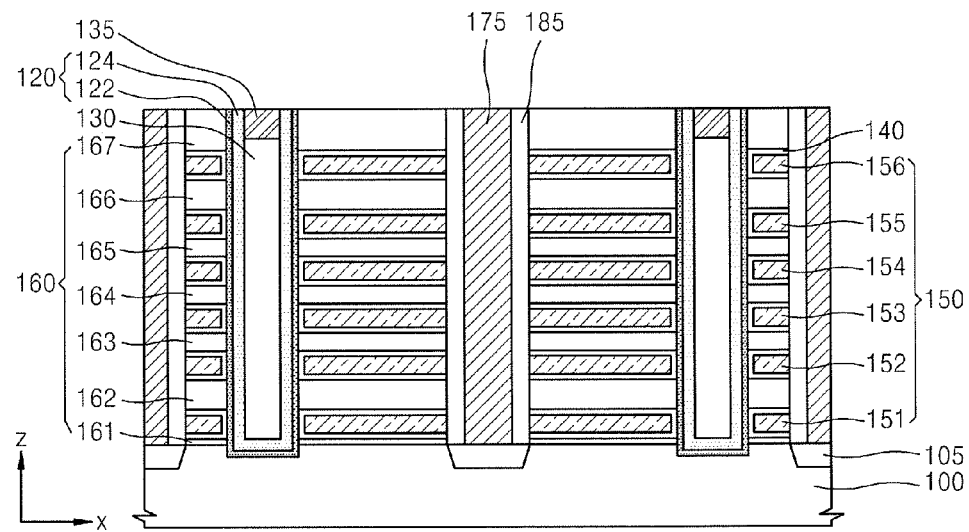

Referring to FIG. 5J, insulating regions 185 and common source lines 175 are formed. For the insulating regions 185, an insulating layer (not shown) is formed on the substrate 100 and side walls of the fourth openings T4 (refer to FIG. 5I), and after that, an anisotropic etching process of the insulating layer is performed so that the insulating regions 185 is formed on the side walls of the fourth openings T4. A portion of the impurity regions 105 may not be covered by the insulating regions 185.

After that, the common source lines 175 may be formed on the substrate 100 and the side walls of the insulating regions 185. The common source lines 175 may be electrically connected to the impurity regions 105 on the substrate 100. The common source lines 175 may be formed of a metal, a metal silicide, or a combination thereof. For example, the common source line 175 may be formed of tungsten, aluminum, copper, or cobalt silicide.

After that, the upper insulating layer 170 (refer to FIG. 5I) and the common source lines 175 may be planarized to the level of the upper surfaces of the channel regions 120 and the conductive layer 135.

Figure 5K:
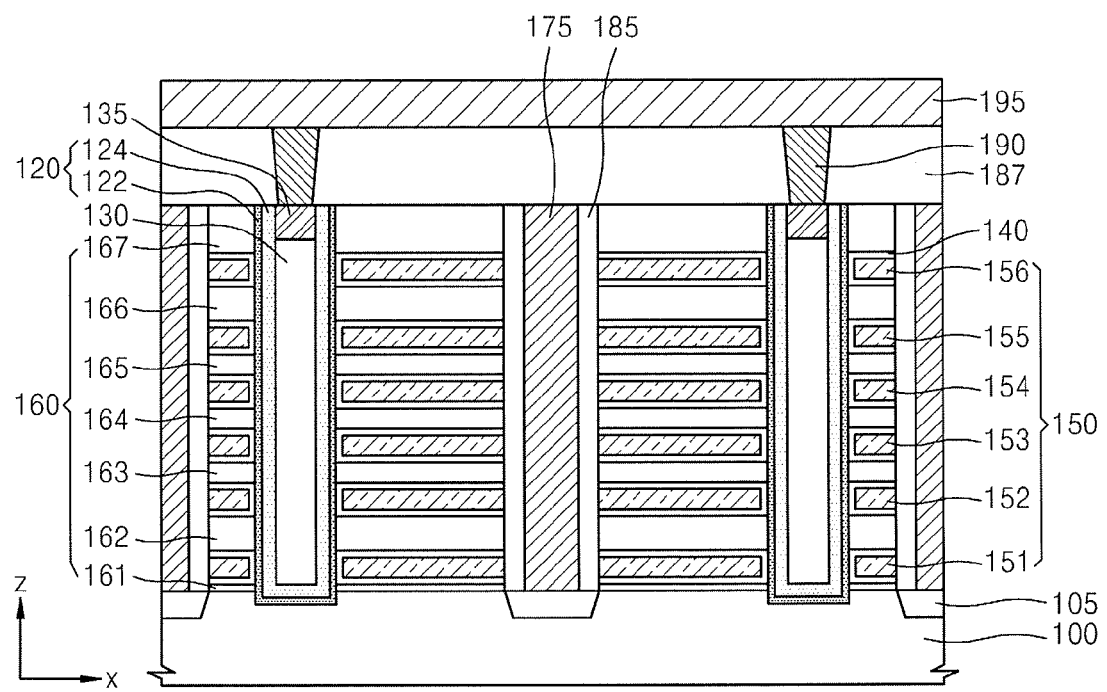

Referring to FIG. 5K, a first insulating interlayer 187 is formed on the resulting structure of FIG. 5J. In other words, the first insulating interlayer 187 is formed on the channel regions 120, the conductive layer 135, the uppermost insulating layer 167, and the common source line 175 of FIG. 5J. Bit line contacts 190 may be formed through the first insulating interlayer 187 to be electrically connected to the channel regions 120 and the conductive layer 135.

After that, a bit line 195 connecting the bit line contacts 190 may be formed on the first insulating interlayer 187. The bit line 195 is arranged to extend in the x-axis direction. The bit line 195 is a line-shaped pattern extending in the x-axis direction.

Semiconductor devices manufactured according to at least on embodiment of the inventive concept may include the channel region 120 having the first semiconductor layer 122 including nitrogen of the first concentration and the second semiconductor layer 124 including nitrogen of the second concentration that is lower than the first concentration. Since the first semiconductor layer 122 includes the Si—N bonding having high binding energy, the increase of the threshold voltage due to electrons being trapped in the channel region 120 may be prevented. Accordingly, the semiconductor device may have electrical characteristics.

FIGS. 6A through 6D are cross-sectional views illustrating a method of manufacturing a semiconductor device according to an embodiment of the present inventive concept. The above method is similar to the method described with reference to FIGS. 5A through 5K except for that a nitridation process is performed to the channel regions 120. Thus, differences of the present embodiment from the previous embodiment will be described. Like reference numerals denote the like elements and any further descriptions with respect to the same element or the same process steps are omitted for brevity.

Figure 6A:
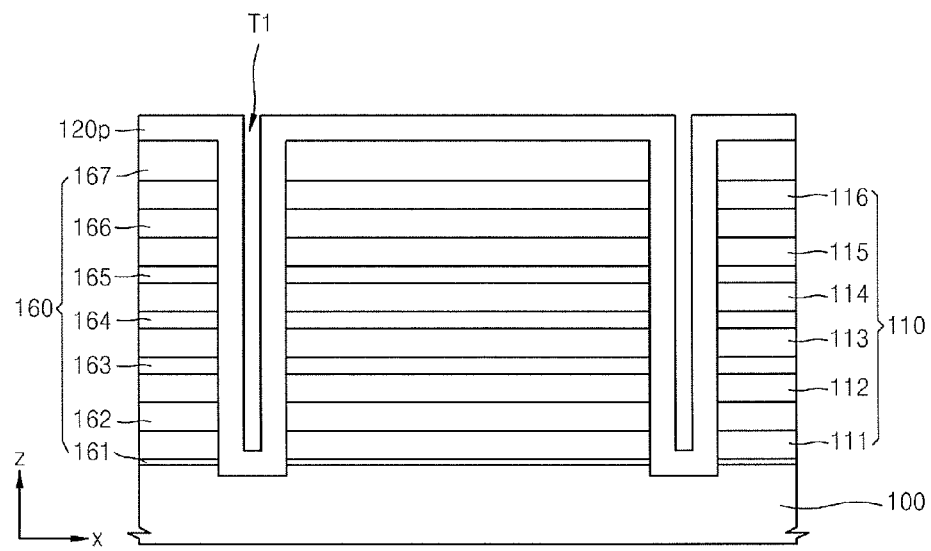
FIGS. 6A through 6D are cross-sectional views illustrating a method of manufacturing a semiconductor device according to an embodiment of the present inventive concept.

Referring to FIG. 6A, the insulating layers 160 (161 through 167) and the sacrificial layers 110 (111 through 116) alternately stacked on the substrate 100 are formed using the processes described with reference to FIGS. 5A and 5B. The first openings T1 exposing the upper surface of the substrate 100 are also formed. In an embodiment, the first opening T1 may have a cross-section formed as a circle, an oval, or a square in the x-y plane or in the z-axis direction. The first opening T1 may have the side walls perpendicular to the upper surface of the substrate 100, and the bottom portion formed on the upper surface of the substrate 100. The upper surface of the substrate 100 may be recessed to a predetermined depth in the z-axis direction.

After that, a semiconductor layer 120p is formed to cover the side walls of the first openings T1 and the recessed upper surface of the substrate 100. In an embodiment, the semiconductor layer 120p may be a polysilicon layer doped with impurities. The impurities may be n-type impurities such as P and As, or p-type impurities such as B. The semiconductor layer 120p may be formed conformally to a thickness less than a width of the first opening T1. Accordingly, the first openings T1 may not be completely filled.

If the first opening T1 has a circular cross-section in the x-y plane, the semiconductor layer 120p in the first opening T1 may be formed as a cylinder or a cup with a closed bottom. Here, a side wall of the semiconductor layer 120p contacting the insulating layers 160 and the sacrificial layers 110 may be referred to as an outer wall, and an exposed side wall of the semiconductor layer 120p may be referred to as an inner wall.

After that, a thermal treatment may be performed under an inert gas atmosphere. In an embodiment, the thermal process may be performed for tens of minutes to a few hours at a temperature of about 550° C. to about 700° C. and a pressure of about 0.1 Torr to about 200 Torr, under the gas atmosphere including nitrogen ($N_2$) gas. In an embodiment, the thermal treatment may be performed by using an inert gas such as He, Ar, or Ne.

Figure 6B:
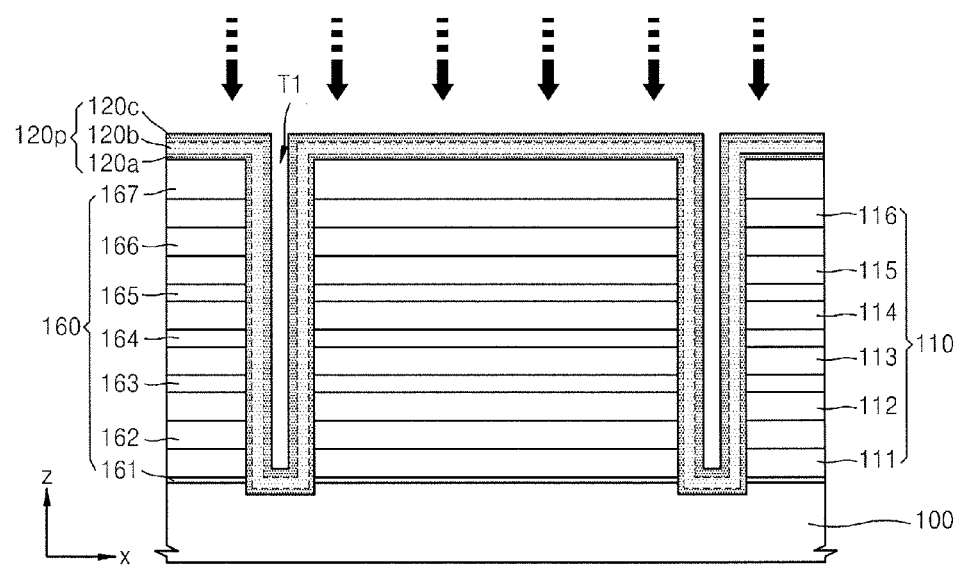

Referring to FIG. 6B, a nitridation process may be performed on the structure shown in FIG. 6A to diffuse nitrogen atoms into the semiconductor layer 120p.

In the exemplary embodiment, the nitridation process may include a rapid thermal nitridation process. In the rapid thermal nitridation process, nitrogen (N) atoms may be implanted into the semiconductor layer 120p and diffused by the rapid thermal nitridation process. Specifically, such nitrogen atoms may be diffused out in a solid-state diffusion to either surface of the semiconductor layer 120p, so that the implanted nitrogen atoms are piled up near either surface of the semiconductor layer 120p. For example, the nitrogen atoms have a concentration profile having the nitrogen atoms being piled up near the inner wall and the outer wall of the semiconductor layer 120p compared to the center of the semiconductor layer 120p. The outer wall of the semiconductor layer 120p contacts the insulating layers 160 and the sacrificial layers 110. Accordingly, the rapid thermal nitridation process may result in a concentration profile where both regions near surface of the semiconductor layer 120p have a higher concentration than the center region.

Based on the concentration profile, the semiconductor layer 120p may be divided into three regions: a first region 120a, a second region 120b, and a third region 120c. The first region 120a is defined as the outermost region of the semiconductor layer 120p having a thickness corresponding to about 5% to about 20% of a total thickness of the semiconductor layer 120p. The first region 120a of the semiconductor layer 120p may include nitrogen atoms at a concentration of 1E20 to 2E21 atoms/$cm^3$, which is converted to about 0.2 to about 0.4 at. %. The third region 120c is defined as the innermost region of the semiconductor layer 120p. The innermost region contacts the alternately stacked layers of the insulating layers 160 and the sacrificial layers 110. The third region has a thickness corresponding to about 10% to about 30% of the total thickness of the semiconductor layer 120p. The third region 120c of the semiconductor layer 120p may include nitrogen atoms at a concentration of 1E19 to 5E21 atoms/cm$^3$. The second region 120b may be a center region of the semiconductor layer 120p between the first region 120a and the third region 120c. The second region 120b may have nitrogen atoms at a concentration of 1E18 to 1E20 atoms/cm$^3$, which is converted to about 20 ppm to about 0.2 at. %.

In an embodiment of the present inventive concept, the nitridation process may be a rapid thermal nitridation process using a gas, for example, $NH_3$, NO, or $N_2O$. The rapid thermal nitridation process may be performed for a few seconds to a few minutes at a temperature of about 600° C. to 900° C. and at a pressure of about 0.1 Torr to about 200 Torr.

In an embodiment of the present inventive concept, the nitridation process may be a remote plasma nitridation process. For example, the nitridation process of the semiconductor layer 120p may be performed under remote-plasma excited nitrogen (N2) gas atmosphere. In the remote plasma nitridation process, the nitridation process may be performed at a temperature of about 600° C. to 900° C. and at a pressure of about 0.1 Torr to about 200 Torr under the nitrogen ($N_2$) gas atmosphere.

In an embodiment of the present inventive concept, the nitridation process may be an annealing process under a gas atmosphere such as $NH_3$, NO, or $N_2O$. For example, the annealing process may be performed tens of minutes to a few hours at a temperature of about 600° C. to 900° C. and a pressure of about 0.1 Torr to about 200 Torr under a gas atmosphere including $NH_3$ gas.

On the other hand, the temperature, the pressure, and time of performing the nitridation process may not be limited thereto. They may vary depending on the thickness of the semiconductor layer 120p so that the nitrogen atoms may be sufficiently diffused and the first region 120a of the semiconductor layer 120p may have the required concentration.

According to the embodiment of the present inventive concept, the semiconductor layer 120p is formed and the nitridation process is performed, thereby diffusing the nitrogen atoms in the semiconductor layer 120p. In addition, defects in the semiconductor layer 120p including polysilicon, in particular, defects of grain boundary, may be cured. For example, the gas including nitrogen atom may reduce dangling bonds of the semiconductor layer 120p, and may substitute the Si—H bonding with the Si—N bonding. Since the Si—N bonding has higher binding energy than that of the Si—H bonding, the trapping density of the semiconductor layer 120p may be reduced. Characteristics of the semiconductor device may be improved due to the reduction of the trapping density, which will be described in more detail with reference to FIGS. 7A through 7C.

Figure 6C:
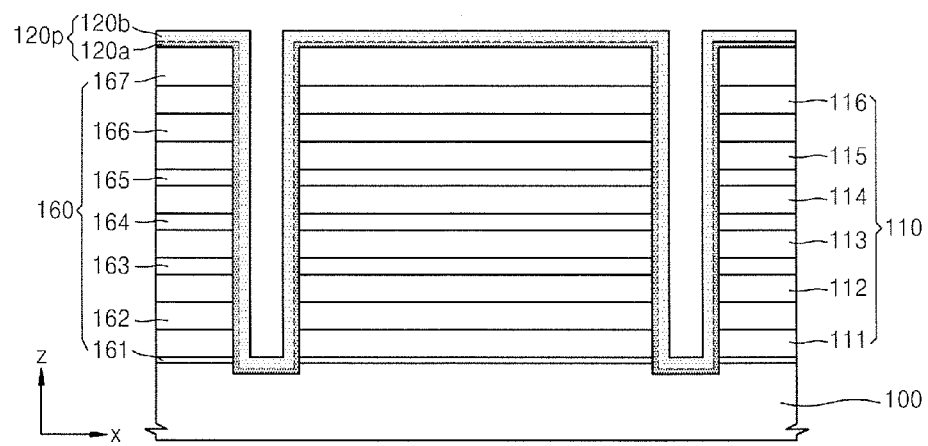

Referring to FIG. 6C, the third region 120c (refer to FIG. 6B) of the semiconductor layer 120p may be removed by a wet-etching process. The nitrogen atoms included in the semiconductor layer 120p may reduce electron mobility or an electrical conductivity of the semiconductor layer 120p. Accordingly, the removal of the third region 120c having higher concentration than the second region 120b may result in the channel regions 120 (refer to FIG. 6D) having higher electrical conductivity due to eliminating the nitrogen atoms from the channel region 120b.

In an embodiment, the wet-etching process may be performed by using standard cleaning-1 (SC-1) solution that is an aqueous solution in which ammonia water and oxygenated water are mixed. According to the wet-etching process, the second region 120b of the semiconductor layer 120p may be exposed.

In an embodiment, before performing the wet-etching process using the SC-1 solution, a wet-etching process using an etchant including phosphoric acid ($HPO_3$) may be further performed. The third region 120c of the semiconductor layer 120p, that is, the region close to the inner wall of the semiconductor layer 120p, has the high concentration of the nitrogen atoms, and thus a silicon nitride layer that is the insulating material may be locally formed. Therefore, the silicon nitride layer may be removed by the above wet-etching process.

The remaining first region 120a and the second region 120b of the semiconductor layer 120p may be referred to as the channel region 120. The channel region 120 may include the first region 120a having a relatively high concentration of nitrogen and the second region 120b having a relatively low concentration of nitrogen.

Figure 6D:
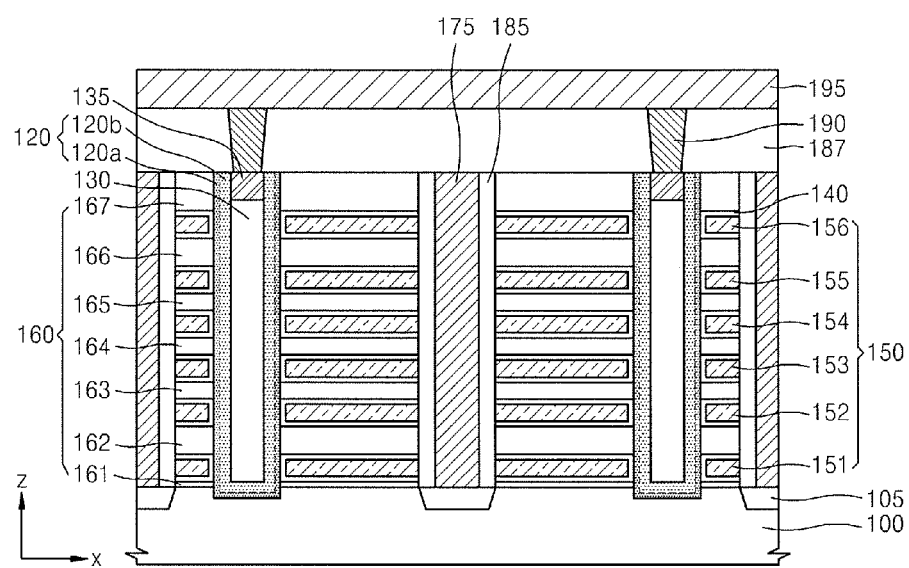

Referring to FIG. 6D, the semiconductor device may be manufactured through the processes described with reference to FIGS. 5E through 5K. Like numerals may refer to like elements and any further descriptions with respect to the same elements and the same process steps are omitted for brevity.

According to an embodiment of the present inventive concept, the nitridation process is performed after forming the semiconductor layer 120p so that the nitrogen atoms in the semiconductor layer 120p are diffused to form the channel region 120 having the first region 120a of a relatively high concentration of nitrogen and the second region 120b of a relatively low concentration of nitrogen. Since the channel region 120 includes the Si—N bonding having a high binding energy, generation of the electron trapping in the channel region 120 may be prevented and the threshold voltage may not be increased. The semiconductor device has improved electrical characteristics.

Figure 7A:
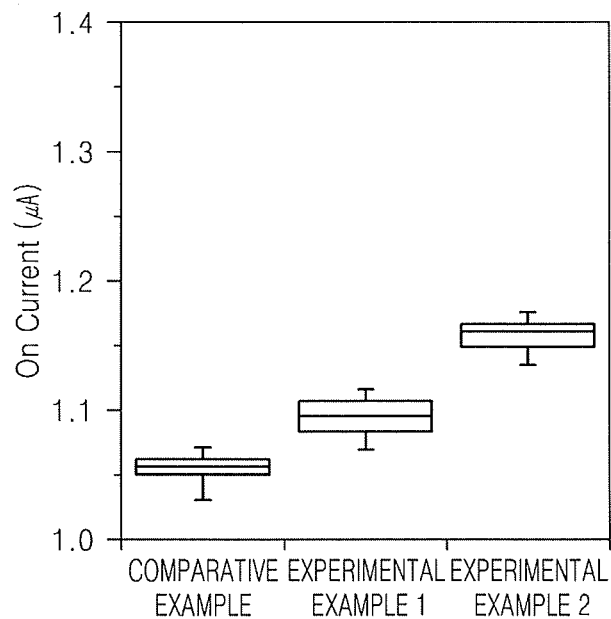
FIGS. 7A through 7C are graphs showing results of testing electrical characteristics of a semiconductor device according to an embodiment of the present inventive concept.
Figure 7B:
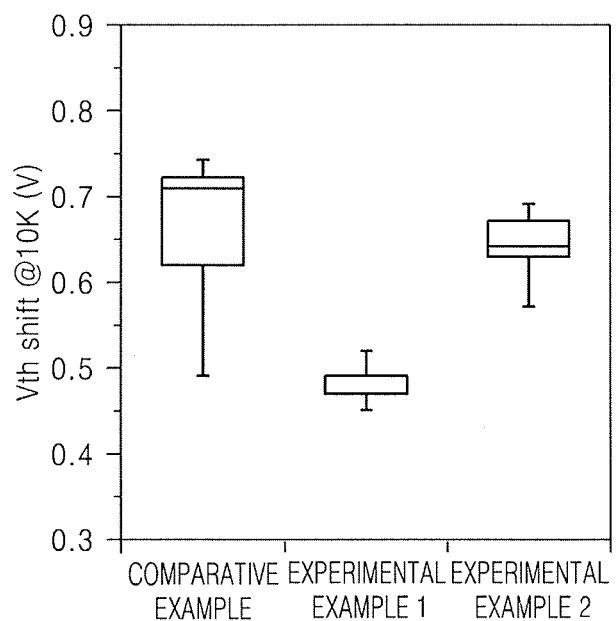
Figure 7C:
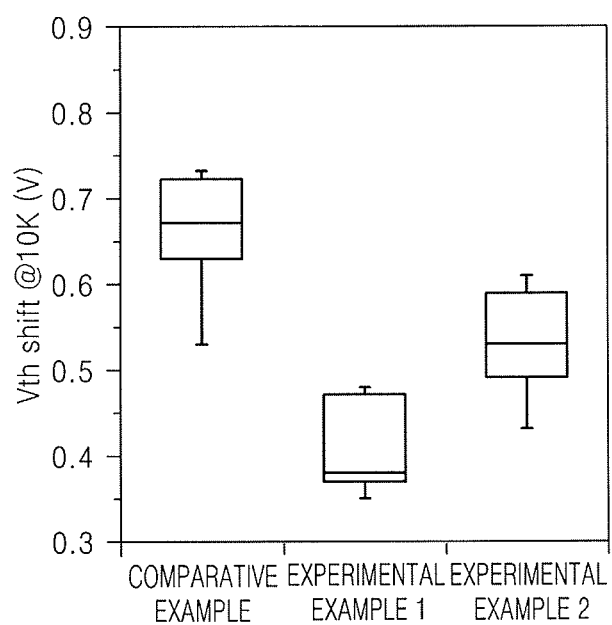

FIGS. 7A through 7C are graphs showing electrical characteristics of a semiconductor device according to an embodiment of the present invention. FIG. 7A is a graph showing on current measurements, and FIGS. 7B and 7C are graphs showing the magnitude of threshold-voltage shift after 10,000 program-erase operation cycles. For purpose of showing that nitrogen atoms included in the channel region improve electrical characteristics, a comparative example used is a semiconductor device manufactured without the nitridation process according to the inventive concept. An experimental example 1 used is a semiconductor device manufactured with the rapid thermal nitridation process; an experimental example 2 used is a semiconductor device manufactured with the remote plasma nitridation process. Here, the comparative sample, the experimental example 1 and the experimental example 2 have NMOS transistor structures. However, the improvement of electrical characteristics resulting from the inclusion of nitrogen atoms in the channel region is made in a PMOS transistor structure.

Referring to FIG. 7A, the comparative example shows an on current of about 1.05 µA, while the experimental examples 1 and 2 show on currents of 1.1 µA and 1.17 µA that are respectively 0.05 µA and 0.11 µA greater than that of the comparative example.

Referring to FIGS. 7B and 7C, a semiconductor device according an embodiment of the inventive concept is shown to have less threshold voltage shift than the comparative example after 10,000 program-erase operation cycles. In FIG. 7B, the measurement of the programming threshold voltage shift after 10,000 program-erase cycles is shown. The comparative example has the threshold voltage shift of about 0.71 V. On the other hand, the experimental example 1 has less threshold voltage shift of about 0.48 V compared to the comparative example; the experimental example 2 has less threshold voltage shift of about 0.64 V compared to the comparative example. In FIG. 7C, the measurement of the erasing threshold voltage shift after 10,000 program-erase cycles is shown.

The comparative example has the threshold voltage shift of about 0.66 V. On the other hand, the experimental example 1 has the threshold voltage shift of about 0.38 V; the experimental example 2 has the threshold voltage shift of about 0.53 V.

Accordingly, the reduction of trapping density may result in the reduction of the threshold voltage shift and the increase of on-current in a semiconductor device according to an embodiment of the inventive concept. In addition, the reduction of the defects existing at the grain boundary may result in the increase of on current in a semiconductor device according to an embodiment of the inventive concept. The on currents of the experimental examples 1 and 2 are greater than that of the comparative example, and the threshold-voltage shift after 10,000 cycles of the experimental examples 1 and 2 is less than that of the comparative example. It may be considered that the above results are obtained from the reduction of the trap density due to the Si—N bonding included in the channel regions of the experimental examples 1 and 2.

Figure 8:
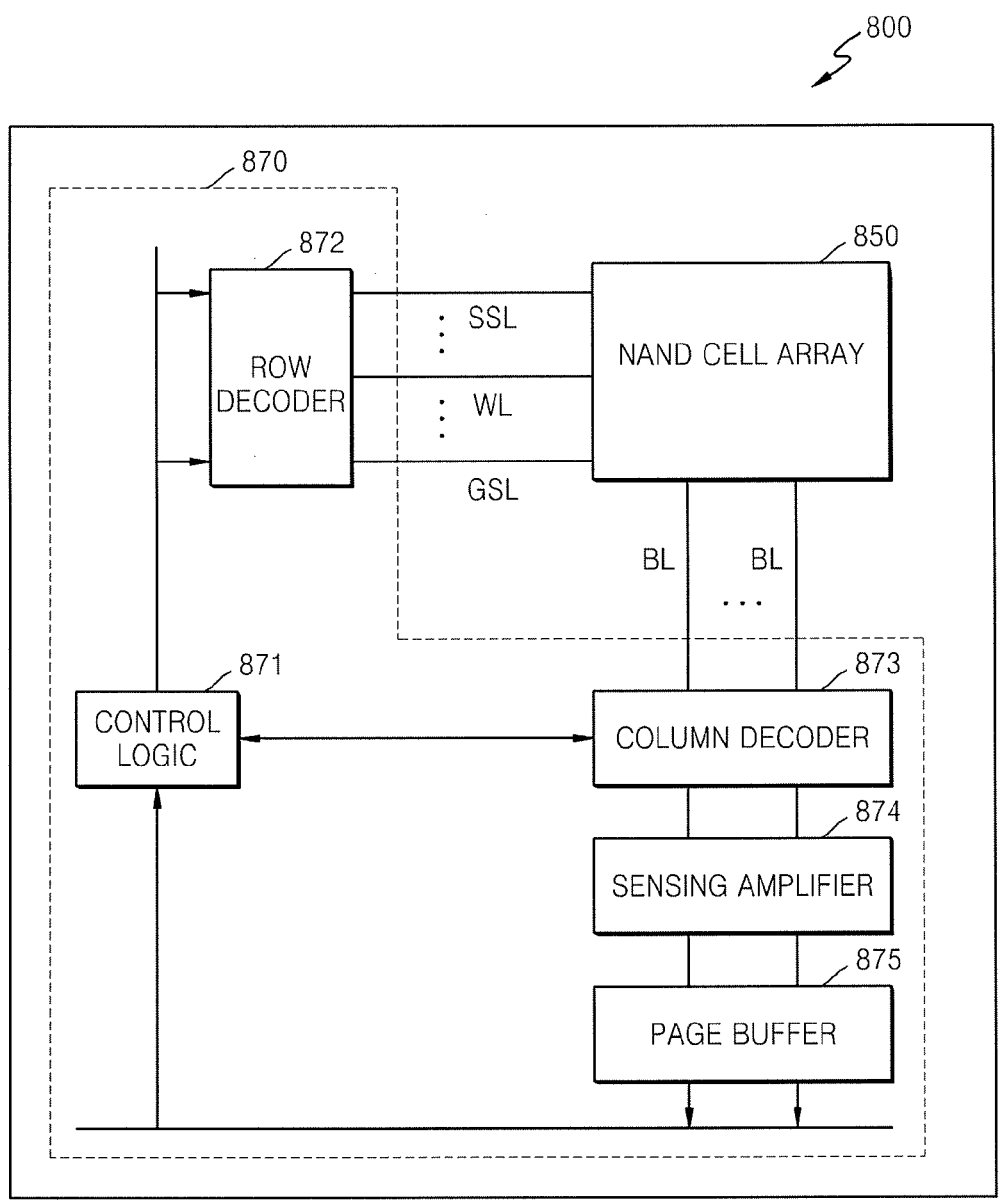
FIG. 8 is a schematic block diagram of a non-volatile memory device according to an embodiment of the present inventive concept.

FIG. 8 is a block diagram schematically showing a non-volatile memory device 800 according to an embodiment of the present inventive concept.

Referring to FIG. 8, in the non-volatile memory device 800, a NAND cell array 850 may be coupled to a core circuit unit 870. For example, the NAND cell array 850 may include a non-volatile memory device of a vertical structure according to the embodiment shown in FIG. 2. The core circuit unit 870 may include a control logic 871, a row decoder 872, a column decoder 873, a sensing amplifier 874, and a page buffer 875.

The control logic 871 may communicate with the row decoder 872, the column decoder 873, and the page buffer 875. The row decoder 872 may communicate with the NAND cell array 850 via a plurality of string selection lines SSL, a plurality of word lines WL, and a plurality of ground selection lines GSL. The column decoder 873 may communicate with the NAND cell array 850 via a plurality of bit lines BL. The sensing amplifier 874 may be connected to the column decoder 873 when a signal is output from the NAND cell array 850, and may not be connected to the column decoder 873 when a signal is transferred to the NAND cell array 850.

For example, the control logic 871 sends a row address signal to the row decoder 872, and the row decoder 872 decodes the row address signal and transfers the row address signal to the NAND cell array 850 via the string selection lines SSL, the word lines WL, and the ground selection lines GSL. The control logic 871 sends a column address signal to the column decoder 873 or the page buffer 875, and the column decoder 873 decodes the column address signal and transfers the column address signal to the NAND cell array 850 via the plurality of bit lines BL. A signal from the NAND cell array 850 is transferred to the sensing amplifier 874 via the column decoder 873, and is amplified to be transferred to the control logic 871 via the page buffer 875.

Figure 9:
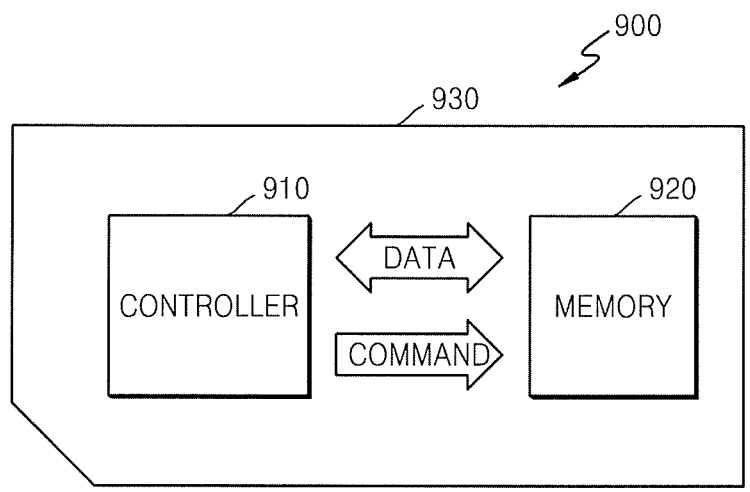
FIG. 9 is a schematic block diagram of a memory card according to an embodiment of the present inventive concept.

FIG. 9 is a block diagram schematically showing a memory card 900 according to an embodiment of the present invention.

Referring to FIG. 9, the memory card 900 may include a controller 910 and a memory 920 built in a housing 930. The controller 910 and the memory 920 may exchange electrical signals with each other. For example, the memory 920 and the controller 910 may transmit/receive data to/from each other according to a command of the controller 910. Accordingly, the memory card 900 may store data in the memory 920 or output the data from the memory 920 to outside.

For example, the memory 920 may include a non-volatile memory device of a vertical structure shown in FIG. 2. The memory card 900 may be used as a data storage medium in various portable devices. For example, the memory card 900 may include a multi-media card (MMC) or a secure digital card (SD).

Figure 10:
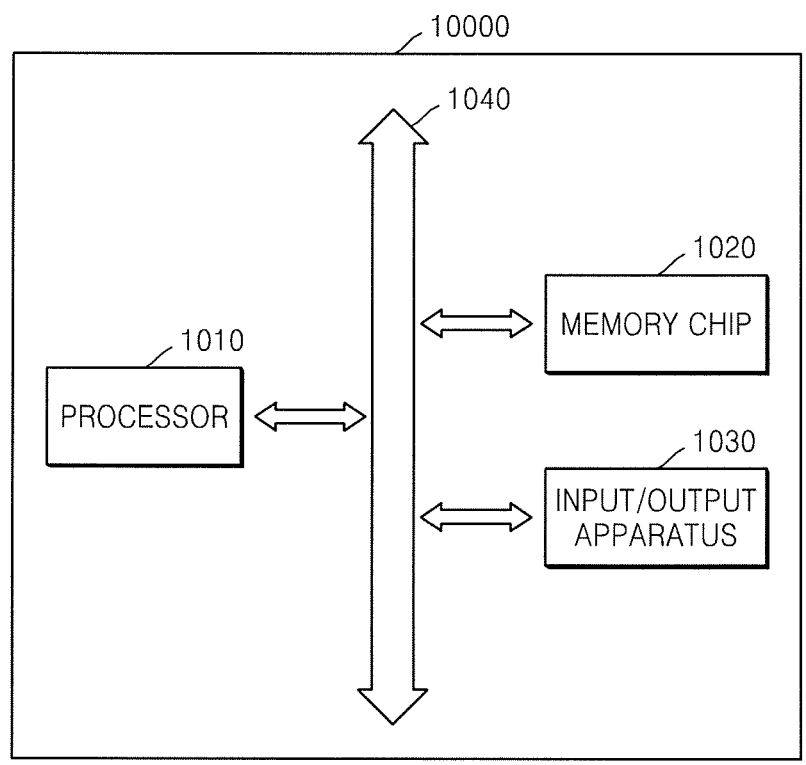
FIG. 10 is a schematic block diagram of an electronic system according to an embodiment of the present inventive concept.

FIG. 10 is a schematic block diagram of an electronic system 10000 according to an embodiment of the present inventive concept.

Referring to FIG. 10, the electronic system 10000 may include a processor 1010, an input/output apparatus 1030, and a memory chip 1020, which may perform data communication with each other via a but 1040. The processor 1010 may execute a program and control the electronic system 10000. The input/output apparatus 1030 may be used to input/output data to/from the electronic system 10000. The electronic system 10000 may be connected to an external device, for example, a personal computer or a network, and may exchange data with the external device by using the input/output apparatus 1030. The memory chip 1020 may store codes and data for operating the processor 1010. For example, the memory chip 1020 may include one of the non-volatile memory devices of the vertical structure shown in FIG. 2.

The electronic system 10000 may configure various electronic control devices requiring the memory chip 1020, for example, mobile phones, MP3 players, navigation systems, solid state disks (SSD), and household appliances.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
   a channel region extending in a vertical direction perpendicular to a substrate;
   a plurality of gate electrodes arranged on a side wall of the channel region and separated from each other in a vertical direction; and
   a gate dielectric layer disposed between the channel region and the gate electrodes,
   wherein the channel region comprises a first semiconductor layer and a second semiconductor layer,
   wherein the first semiconductor layer includes nitrogen atoms of a first concentration near an interface between the channel region and the gate dielectric layer,
   wherein one side of the first semiconductor layer is in contact with the gate dielectric layer and other side of the first semiconductor layer is in contact with the second semiconductor layer, and
   wherein a thickness of the first semiconductor layer is less than a thickness of the second semiconductor layer.

2. The semiconductor device of claim 1, wherein the second semiconductor layer includes nitrogen atoms of a second concentration that is lower than the first concentration.

3. The semiconductor device of claim 2, wherein the second concentration of the nitrogen in the second semiconductor layer ranges from about 20 ppm to about 0.2 at. %.

4. The semiconductor device of claim 2, wherein the first semiconductor layer is a cylindrical structure including a closed bottom, the closed bottom being in contact with the substrate, and the second semiconductor layer is formed on an entire inner wall of the first semiconductor layer.

5. The semiconductor device of claim 4, further comprising an insulating pillar disposed on the second semiconductor layer.

6. The semiconductor device of claim 4, wherein the substrate includes a recessed region and the closed bottom is disposed in the recessed region.

7. The semiconductor device of claim 1, wherein the first concentration of the nitrogen in the first semiconductor layer ranges from about 0.2 at. % to about 4 at. %.

8. The semiconductor device of claim 1, wherein a thickness of the second semiconductor layer ranges from twice to twenty times that of the first semiconductor layer.

9. The semiconductor device of claim 8, wherein the channel region comprises silicon-nitrogen bonding.

10. The semiconductor device of claim 1, wherein the gate dielectric layer comprises a tunnel insulating layer, a charge trapping layer, and a blocking insulating layer that are sequentially stacked on the side wall of the channel region, wherein the gate dielectric layer is disposed on the channel region.

11. The semiconductor device of claim 1, wherein the channel region is a pillar structure whose outer wall is a first region and whose inside is a second region disposed in the first region, wherein the first region includes nitrogen atoms at a first concentration and the second region includes nitrogen atoms at a second concentration less than the first concentration.

12. The semiconductor device of claim 1, further comprising a plurality of insulating layers disposed between the gate electrodes, respectively, wherein a lowermost insulating layer of the insulating layers is in contact with the substrate.

13. The semiconductor device of claim 1, wherein the first and second semiconductor layers are formed of polysilicon.

* * * * *